United States Patent
Cameron et al.

(10) Patent No.: US 7,085,985 B2
(45) Date of Patent: Aug. 1, 2006

(54) CLOSE TWO CONSTITUENT TRELLIS OF A TURBO ENCODER WITHIN THE INTERLEAVE BLOCK

(75) Inventors: Kelly Brian Cameron, Irvine, CA (US); Ba-Zhong Shen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 522 days.

(21) Appl. No.: 10/264,767

(22) Filed: Oct. 4, 2002

(65) Prior Publication Data

US 2003/0226088 A1    Dec. 4, 2003

Related U.S. Application Data

(60) Provisional application No. 60/384,698, filed on May 31, 2002, provisional application No. 60/384,470, filed on May 31, 2002.

(51) Int. Cl.
    *H03M 13/00*     (2006.01)
(52) U.S. Cl. .............. 714/755; 714/786; 714/792; 714/701; 375/265; 375/341; 375/262
(58) Field of Classification Search ............. 714/755, 714/786, 792, 795, 756, 701; 375/265, 341, 375/262
    See application file for complete search history.

(56) References Cited

U.S. PATENT DOCUMENTS

| | | | |
|---|---|---|---|
| 5,406,570 A | 4/1995 | Berrou et al. | |
| 5,446,747 A | 8/1995 | Berrou | |
| 5,563,897 A | 10/1996 | Pyndiah et al. | |
| 6,065,147 A | 5/2000 | Pyndiah et al. | |
| 6,119,264 A | 9/2000 | Berrou et al. | |
| 6,122,763 A | 9/2000 | Pyndiah et al. | |
| 6,212,654 B1 * | 4/2001 | Lou et al. ................ | 714/701 |
| 6,275,538 B1 * | 8/2001 | Ramesh et al. ............ | 375/265 |
| 6,598,204 B1 * | 7/2003 | Giese et al. .............. | 714/795 |

FOREIGN PATENT DOCUMENTS

| | | |
|---|---|---|
| EP | 0 735 696 A2 | 10/1996 |
| EP | 0 735 696 A3 | 1/1999 |
| FR | 91 05278 A1 | 10/1992 |

* cited by examiner

*Primary Examiner*—Guy J. Lamarre
(74) *Attorney, Agent, or Firm*—Garlick Harrison & Markison LLP; Shayne X. Short

(57) ABSTRACT

Close two constituent trellis of a turbo encoder within the interleave block. The state of a multi-state encoder is forced to a known/predetermined state at the end and beginning of each data frame. Packet based and/or frame based data transmissions benefit greatly when the encoder state of a multi-state encoder is known at the beginning and end of each frame. Appropriately chosen symbols, selected to force the encoder to a known state at the end of a data frame, may be padded to the end of a data frame that is to be encoded; this will force the encoder to "close" at the end of the data frame. These closure symbols may also be padded to the end of the data frame before the data frame in interleaved. Moreover, within encoder embodiments that include multiple constituent encoders, both constituent encoders will be forced to the known/predetermined state.

34 Claims, 25 Drawing Sheets rate 2/3 (13/11) encoder cellular communication system 300 cellular communication system 400 uni-directional communication system 700 bi-directional communication system 800 one to many communication system 900 fiber-optic communication system

TTCM communication system rate 2/3 (13/11) encoder turbo encoder closure operable convolutional encoder Fig. 14 generic embodiment of variable puncturing, constellations, and mapping using single encoder single interleaver embodiment of turbo encoder dual interleaver embodiment of turbo encoder closure generator and encoder functionality trellis of 8 state (3 register), 2 bit input symbol, rate 2/5 encoder example of closure governed trellis transitions of 8 state (3 register), 2 bit input symbol, rate 2/5 encoder closure functionality of $2^m$ state encoder encoder closure functionality

CLOSE TWO CONSTITUENT TRELLIS OF A TURBO ENCODER WITHIN THE INTERLEAVE BLOCK

CROSS REFERENCE TO RELATED PATENTS/PATENT APPLICATIONS

The present U.S. Utility Patent Application claims priority pursuant to 35 U.S.C. § 119(e) to the following U.S. Provisional Patent Applications that are hereby incorporated herein by reference in their entirety and are made part of the present U.S. Utility Patent Application for all purposes:

1. U.S. Provisional Patent Application Ser. No. 60/384,698, entitled "VARIABLE CODE RATE AND SIGNAL CONSTELLATION TURBO TRELLIS CODED MODULATION CODEC," filed May 31, 2002, pending.

2. U.S. Provisional Patent Application Ser. No. 60/384,470, entitled "CLOSE TWO CONSTITUENT TRELLIS OF A TURBO ENCODER WITHIN THE INTERLEAVE BLOCK," filed May 31, 2002, pending.

The following U.S. Utility Patent Application, being filed concurrently, is hereby incorporated herein by reference in its entirety and made part of the present U.S. Utility Patent Application for all purposes:

1. U.S. Utility patent application Ser. No. 10/264,486, entitled "VARIABLE CODE RATE AND SIGNAL CONSTELLATION TURBO TRELLIS CODED MODULATION CODEC," filed Oct. 4, 2002, pending.

BACKGROUND OF THE INVENTION

1. Technical Field of the Invention

The invention relates generally to communication systems; and, more particularly, it relates to communication systems that employ an encoder to encode symbols of a data frame.

2. Description of Related Art

Data communication systems have been under continual development for many years. In an effort to improve the reliability of encoding of signals that are transmitted across a communication channel, one approach has been to employ multi-state encoders operable to support trellis encoding in an effort to provide a high level of redundancy of encoded information transmitted across a communication channel. The monitoring and tracking of the state of an encoder is often difficult when encoding a large sequence of information. For example, there is often a difficulty in aligning the various data frames when they are encoded using a multi-state encoder. For example, the state of the encoder will affect the encoding of information within the sequence. When the state of the encoder is unknown or in an undesirable state when beginning to encode a sequence of data, or when finishing encoding the sequence of data, the encoding of the sequence of data may be performed in a sub-optimal manner.

One prior art approach of controlling the state of a single encoder is to provide a number of zero valued symbols, the total number to zero valued symbols being equal to or greater than the total number of registers employed within the single encoder to force the single encoder to a zero valued state at the end of the sequence. This prior art approach can be very bandwidth consumptive. For example, when encoding a data frame having a number of symbols, by encoding several zero valued symbols to force the encoder to a zero valued state, the encoding sacrifices throughput to ensure that the encoder is at a predetermined state. For example, for every zero valued symbol that is encoded to force the encoder to this predetermined state, a symbol of information is sacrificed. In embodiments that include some sort of interleaving, the zero valued symbols are padded to an end of a data frame and they are not interleaved. For example, the other symbols of a data frame will be interleaved, and then the zero valued symbols will then simply be added to the end of the data frame before the data frame is provided to an encoder. However, this prior art approach suffers some significant degradation in performance, in that, the zero valued symbols are not interleaved.

The problem becomes even more complicated when an encoder device includes more than one constituent encoder. Moreover, the problem is even more extreme when one or more types of interleaving is performed during the encoding process. There is no adequate means existent in the art that can ensure the multiple constituent encoders return to a predetermined state after encoding a sequence of data.

For example, another prior art approach may be found within the context of turbo coders. A traditional turbo encoder includes two constituent encoders and a single interleaver that interleaves the input data that is provided to one of the constituent encoders. In this prior art approach, there is no solution to deal with the interleaving. Zero valued symbols will be padded to the data before it is provided to the interleaver, and subsequently to the one of the constituent encoders that is preceded by the interleaver. However, this constituent encoder (the one preceded by the interleaver) will not be forced to a predetermined state. Only the other constituent encoder (the one NOT preceded by the interleaver) will be forced to the predetermined state. That is to say, only one of the two constituent encoders will be forced to a predetermined state after encoding a data frame. This will inherently introduce some degradation of performance.

As such, there exists a need in the art to develop a more efficient means of forcing one or more encoders to a predetermined state at the end of encoding a sequence of data. In addition, there does not exist in the art a solution to accommodate with the effects of interleaving on the sequence of data. By ensuring that the one or more encoders are in fact at the predetermined state when beginning to encode the sequence of data, as well as when finishing encoding the sequence of data, and also be accommodating the effects of any interleaving, improved and more efficient encoding would be achieved.

BRIEF SUMMARY OF THE INVENTION

Various aspects of the invention can be found in a method for determining closure symbols that will force an encoder to a predetermined state. The method involves assessing the impulse response states of the encoder. In addition, for each impulse response state of the encoder, the method involves finding a minimum number of input symbols that, when applied to the encoder, will force the encoder to the predetermined state. For a data frame of input symbols that will place the encoder into a particular impulse response state, the method also involves determining a minimum number of encoder state transitions required to force the encoder to the predetermined state. The method also involves selecting closure symbols, from the minimum number of input symbols that, when padded to an end of the data frame, will force the encoder to undergo the minimum number of encoder state transitions when transitioning from one impulse response state to the predetermined state. The method involves padding the closure symbols to the end of the data frame and encoding the data frame. The encoding of the data frame forces the encoder to the predetermined state at the end of the data frame.

In some embodiments, the data frame that includes the closures symbols padded to the end of the data frame and a remaining number of input symbols, and the method involves interleaving the data frame, that includes the closure symbols and the remaining input symbols, before encoding the data frame. It is noted that the closure symbols may be interleaved throughout a data frame along with the input symbols, and the interleaved data frame will still force the encoder to the predetermined state at the end of the data frame.

In certain embodiments, encoder number of closure symbols will be fewer than the number of registers the encoder contains. In this situation, a substantial bandwidth savings may be achieved. For example, in one embodiment of an encoder that includes three registers, the total number of closure symbols required is only two.

Other aspects of the preset invention may be found in a closure operable encoder. The encoder includes a constituent encoder and a closure generator. The constituent encoder encodes input symbols, and the closure generator that assesses impulse response states of the constituent encoder. For each impulse response state of the constituent encoder, the closure generator finds a minimum number of input symbols that, when applied to the constituent encoder, will force the constituent encoder to the predetermined state. For a data frame including input symbols that will place the constituent encoder into a particular impulse response state, the closure generator determines a minimum number of encoder state transitions required to force the constituent encoder to the predetermined state. The closure generator selects closure symbols, from the minimum plurality of input symbols that, when padded to an end of the data frame, will force the constituent encoder to undergo the minimum number of encoder state transitions when transitioning from one impulse response state of to the predetermined state. The closure generator pads the closure symbols to the end of the data frame, and the constituent encoder is forced to the predetermined state at the end of the data frame when encoding the data frame.

The encoder may also include an interleaver, communicatively coupled to the constituent encoder, that is operable to interleave the data frame that includes both the input symbols and the closure symbols. The constituent encoder is then forced to the predetermined state at the end of the data frame when encoding the interleaved data frame. The invention is operable to accommodate the situation where the closure symbols are interleaved throughout the data frame along with the input symbols.

The encoder may also include a rate control sequencer that directs the encoder to encode the input symbols according to a rate control sequence. Again, the rate control sequence includes a number of modulations, and each modulation includes a constellation and a mapping.

Other aspects of the invention may be found in an encoder that includes a top interleaver, a top constituent trellis encoder that is communicatively coupled to the top interleaver, a bottom interleaver, a bottom constituent trellis encoder that is communicatively coupled to the bottom interleaver, a closure generator that is communicatively coupled to the top interleaver and the bottom interleaver, and a multiplexor that alternatively selects encoded bits that are output from the top constituent trellis encoder and the bottom constituent trellis encoder. The closure generator assesses impulse response states for both the top constituent trellis encoder and the bottom constituent trellis encoder. For each impulse response state of the top constituent trellis encoder and the bottom constituent trellis encoder, the closure generator finds a minimum number of input symbols that, when applied to one or both of the top constituent trellis encoder and the bottom constituent trellis encoder, will force one or both top constituent trellis encoder and the bottom constituent trellis encoder to the predetermined state. For a data frame including input symbols that will place one or both of the top constituent trellis encoder and the bottom constituent trellis encoder into a particular impulse response state, the closure generator determines a minimum number of encoder state transitions required to force one or both of the top constituent trellis encoder and the bottom constituent trellis encoder to the predetermined state. The closure generator selects closure symbols, from the minimum plurality of input symbols that, when padded to an end of the data frame, can force both of the top constituent trellis encoder and the bottom constituent trellis encoder to undergo the minimum number of encoder state transitions when transitioning from one impulse response state to the predetermined state. The closure generator pads the closure symbols to the end of the data frame. The top interleaver interleaves the data frame that includes the input symbols and the closure symbols, and the bottom interleaver interleaves the data frame that includes the input symbols and the closure symbols. One or both of the top constituent trellis encoder and the bottom constituent trellis encoder is forced to the predetermined state at the end of the data frame when encoding the data frame.

In some embodiments, both the top constituent trellis encoder and the bottom constituent trellis encoder are forced to the predetermined state at the end of the data frame when encoding the data frame. The encoder may also include a rate control sequencer that directs the top constituent trellis encoder and the bottom constituent trellis encoder to encode the input symbols according to a rate control sequence. The rate control sequence includes a number of modulations, and each modulation includes a constellation and a mapping. The encoder may also include a puncturing functional block that punctures a predetermined number of the encoded bits that are output from the multiplexor according to the modulation of the rate control sequence.

A number of types of encoders may be implemented according to the invention including a convolutional encoder, a turbo encoder having a single interleaver, a turbo encoder having dual interleavers, and/or a Turbo Trellis Coded Modulation (TTCM) encoder. In some of these embodiments, the encoder itself includes two constituent encoders, and the closure methodology will force both of those two constituent encoders to the predetermined state. The input symbols may be encoded according to a rate control sequence. Each rate control sequence includes a number of modulations, and each modulation includes a constellation and a mapping. The encoder may be implemented within a variety of devices including a satellite transmitter, a High Definition Television (HDTV) transmitter, a mobile transmitter, a base station transmitter, a transmitter, a mobile unit, a transceiver, and/or a Dense Wavelength Division Multiplexing (DWDM) line card. When the encoder is implemented within a communication transmitter, the corn transmitter may be implemented within a variety of communication systems including a satellite communication system, a High Definition Television (HDTV) communication system, a cellular communication system, a microwave communication system, a point-to-point communication system, a unidirectional communication system,

DETAILED DESCRIPTION OF THE INVENTION

Figure 1:
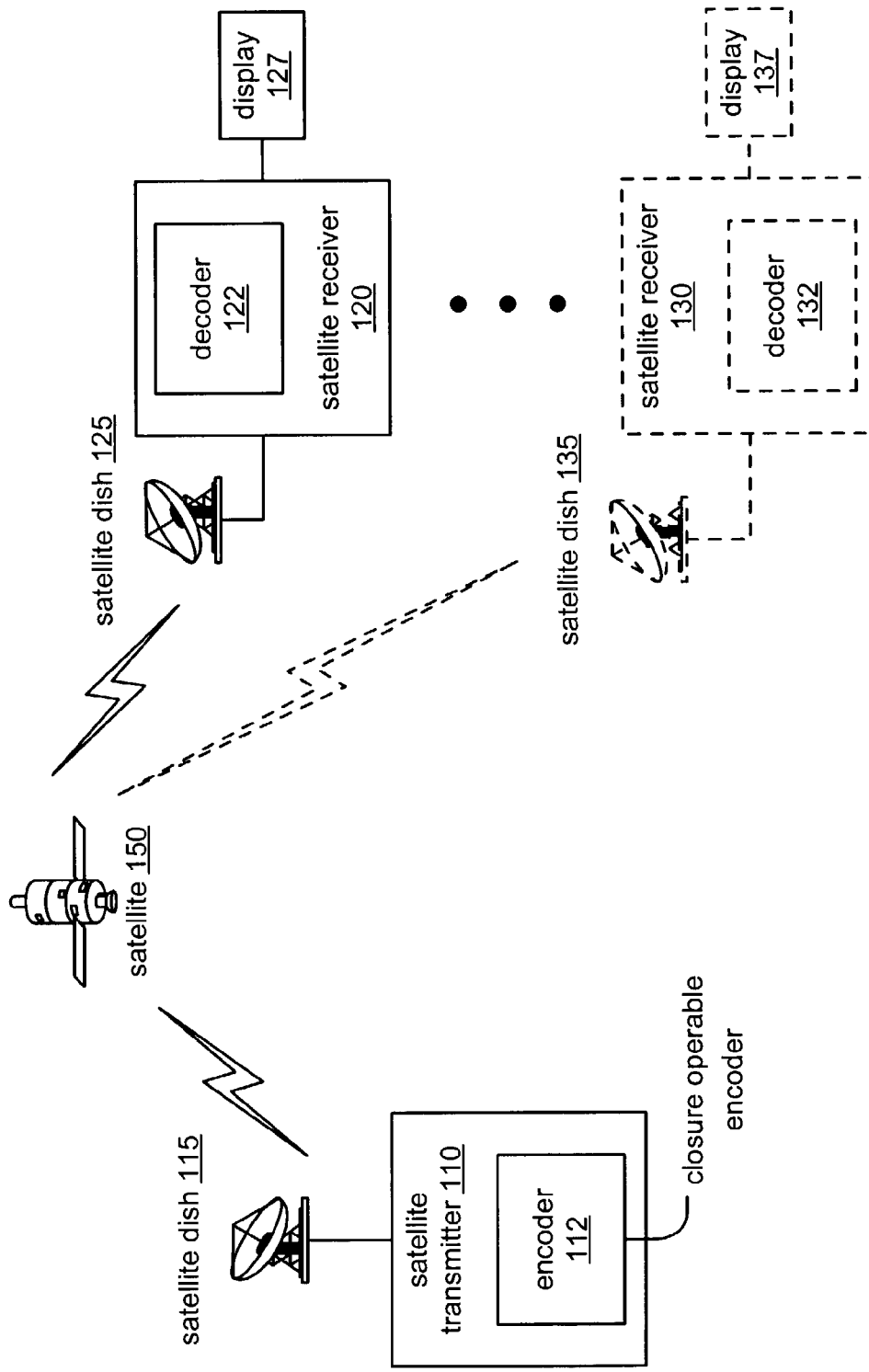
FIG. 1 is a system diagram illustrating an embodiment of a satellite communication system that is built according to the invention.

The invention provides a solution to ensure that an encoder is at a known/predetermined state at the beginning and ending of a data frame that is to be encoded. In the trellis code modulation (TCM) context, it is important to know the state of the trellis at the end of each data frame (e.g., the state of the encoder when finishing encoding a data frame) so that various frames can be properly aligned with one another. The invention is able to flush, or close, (get the state of the encoder to a known/predetermined state) using a fewer number of input symbols than has ever been performed in the art. In addition, the invention is able to accommodate the effects of interleaving as well. In embodiments employing multiple constituent encoders, the invention is able to force both of the constituent encoders to the known/predetermined state.

The transitions of the encoder are ascertained, and then the order of transitions of the encoder is determined, then this knowledge is employed to send appropriately chosen symbols that will transition the encoder to the known (e.g., zero) state. The selection of these symbols will be based on any interleaving that is to be performed during the encoding. For example, known symbols are sent to the encoder and the states/state transitions are determined. Afterwards, using the linearity of the encoder, this information is used to select those symbols that will ensure that the encoder forces to a known/predetermined state at the end of a data frame to be encoded. The invention can accommodate encoder embodiments that perform interleaving as well as those that employ no interleaving.

For example, in one embodiment of an eight state encoder (3 register), a typical approach would be to send three zero valued symbols to the encoder, those three zero valued symbols being padded at the end of a data frame, so that the state of the encoder is returned to a zero state when it completes encoding the data frame.

However, the invention is able to perform the closure operation using only 2 symbols thereby providing a bandwidth savings of at least one symbol per data frame in this particular embodiment. These symbols may not necessarily be zero valued symbols. More specifically, within this 8 state encoder embodiment example, the states of the encoder are mapped based on a known input symbol sequence (as provided by the data frame). Then, the state/state transitions of the encoder are determined when 2 zero valued symbols are provided at the end of the data frame. This is a savings of one symbol per data frame compared to the prior art (that uses 3 symbols). A savings of one symbol, in this embodiment, for every data frame, could provide for very extensive savings across a large number of data frames.

The invention is also operable within multi-state encoders that may receive multi-bit input symbols. The invention is operable within any number of types of encoders including a single convolutional encoder, a single interleaver embodiment of a turbo encoder, a dual interleaver embodiment of a turbo encoder, a Turbo Trellis Coded Modulation (TTCM) encoder, an encoder that employs more than one constituent encoder (one example being an encoder with two constituent encoders), or any other encoder in whose application it is desirous to know the state of the encoder at the beginning/end of a data frame.

The encoder closure functionality supported by the invention may be described as being performed within a variety of communication systems. FIGS. 1–10 illustrate a number of communication system context embodiments where the encoder closure functionality of the invention may be implemented.

FIG. 1 is a system diagram illustrating an embodiment of a satellite communication system 100 that is built according to the invention. A satellite transmitter 110 includes an encoder 112. The encoder 112 is a closure operable encoder. The encoder 112 is operable to encode data that is to be transmitted by the satellite transmitter 110. The satellite transmitter 110 is communicatively coupled to a satellite dish 115 that is operable to communicate with a satellite 150. The satellite transmitter 110 may also be communicatively coupled to a wired network. This wired network may include any number of networks including the Internet, proprietary networks, and other wired and/or wireless networks. The satellite transmitter 110 employs the satellite dish 115 to communicate to the satellite 150 via a wireless communication channel. The satellite 150 is able to communicate with one or more satellite receivers, shown as a satellite receiver 120 (having a satellite dish 125), and a satellite receiver 130 (having a satellite dish 135). Each of the satellite receiver 120 and the satellite receiver 130 includes a decoder; specifically, the satellite receiver 120 includes a decoder 122, and the satellite receiver 130 includes a decoder 132. Each of the satellite receiver 120 and the satellite receiver 130 may also be communicatively coupled to a display. Specifically, the satellite receiver 120 may be communicatively coupled to a display 127, and the satellite receiver 130 may be communicatively coupled to a display 137. Various and further details will be provided below regarding the various embodiments in which the encoder 112 may be implemented to perform the encoder closure functionality of the invention.

Here, the communication to and from the satellite 150 may cooperatively be viewed as being a wireless communication channel, or each of the communication legs to and from the satellite 150 may be viewed as being two distinct wireless communication channels.

For example, the wireless communication "channel" may be viewed as not including multiple wireless hops in one embodiment. In other embodiments, the satellite 150 receives a signal received from the satellite transmitter 110 (via its satellite dish 115), amplifies it, and relays it to satellite receiver 120 (via its satellite dish 125); the satellite receiver 120 may also be implemented using terrestrial receivers such as satellite receivers, satellite based telephones, and satellite based Internet receivers, among other receiver types. In the case where the satellite 150 receives a signal received from the satellite transmitter 110 (via its satellite dish 115), amplifies it, and relays it, the satellite 150 may be viewed as being a "transponder." In addition, other satellites may exist that perform both receiver and transmitter operations in cooperation with the satellite 150. In this case, each leg of an up-down transmission via the wireless communication channel would be considered separately.

In whichever embodiment, the satellite 150 communicates with the satellite receiver 120. The satellite receiver 120 may be viewed as being a mobile unit in certain embodiments (employing a local antenna); alternatively, the satellite receiver 120 may be viewed as being a satellite earth station that may be communicatively coupled to a wired network in a similar manner in which the satellite transmitter 110 may also be communicatively coupled to a wired network. In both situations, the satellite receiver 120 and the satellite receiver 130 are each operable to support the decoder 122 and the decoder 132 contained therein, respectively.

The FIG. 1 shows one of the many embodiments where a closure operable encoder may be implemented according to any one or more of the various embodiments of the invention.

Figure 2:
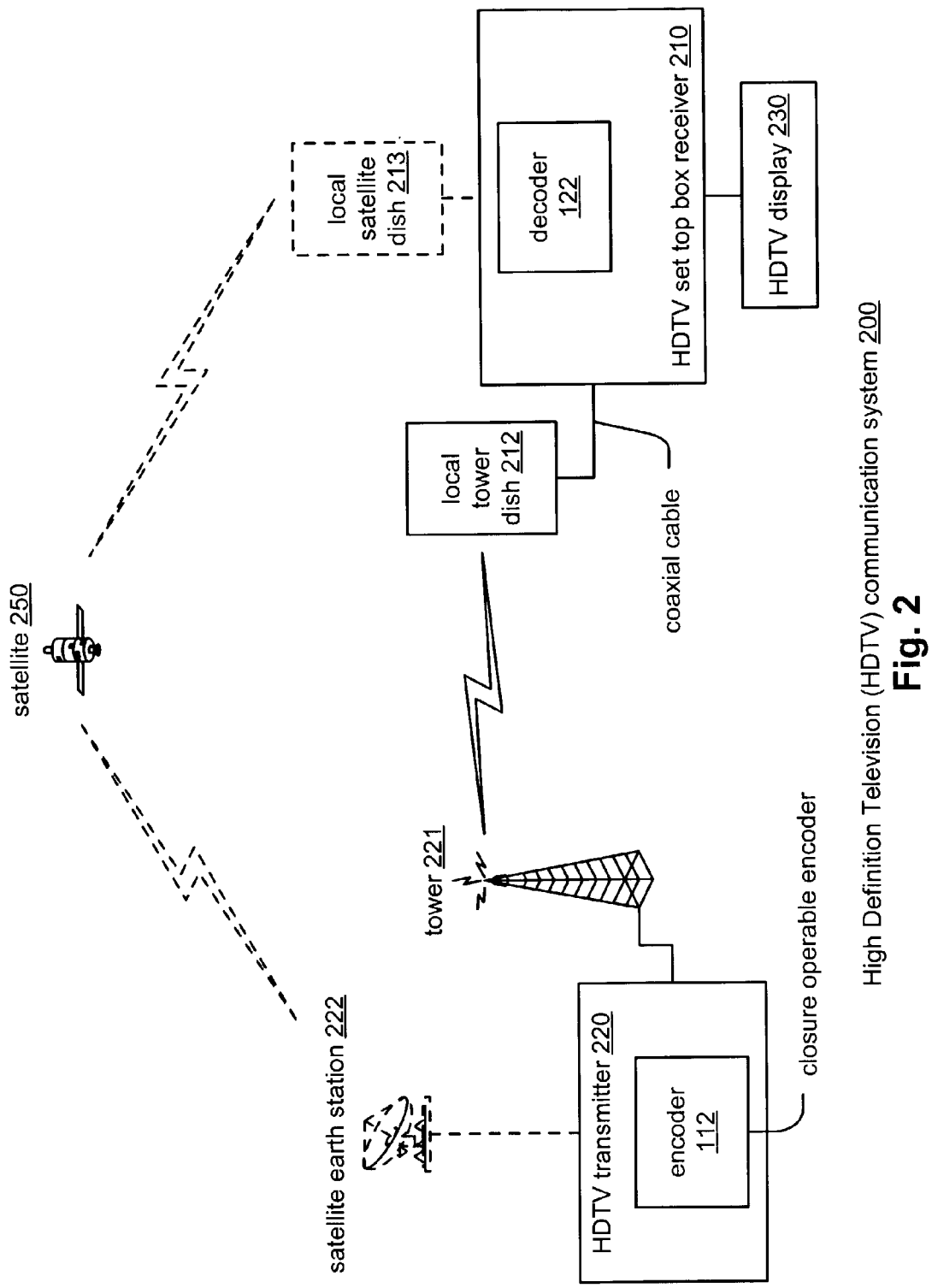
FIG. 2 is a system diagram illustrating an embodiment of a High Definition Television (HDTV) communication system that is built according to the invention.

FIG. 2 is a system diagram illustrating an embodiment of a High Definition Television HDTV communication system 200 that is built according to the invention. An HDTV transmitter 220 is communicatively coupled to a tower 221. The HDTV transmitter 220, using its tower 221, transmits a signal to a local tower dish 212 via a wireless communication channel. The local tower dish 212 communicatively couples to an HDTV set top box receiver 210 via a coaxial cable. The HDTV set top box receiver 210 includes the functionality to receive the wireless transmitted signal that has been received by the local tower dish 212; this may include any transformation and/or down-converting as well that may be needed to accommodate any up-converting that may have been performed before and during transmission of the signal from the HDTV transmitter 220 and its tower 221.

The HDTV set top box receiver 210 is also communicatively coupled to an HDTV display 230 that is able to display the demodulated and decoded wireless transmitted signals received by the HDTV set top box receiver 210 and its local tower dish 212. The HDTV transmitter 220 (via its tower 221) transmits a signal directly to the local tower dish 412 via the wireless communication channel in this embodiment. In alternative embodiments, the HDTV transmitter 220 may first receive a signal from a satellite 250, using a satellite earth station 222 that is communicatively coupled to the HDTV transmitter 220, and then transmit this received signal to the to the local tower dish 212 via the wireless communication channel. In this situation, the HDTV transmitter 220 operates as a relaying element to transfer a signal originally provided by the satellite 250 that is destined for the HDTV set top box receiver 210. For example, another satellite earth station may first transmit a signal to the satellite 250 from another location, and the satellite 250 may relay this signal to the satellite earth station 222 that is communicatively coupled to the HDTV transmitter 220. The HDTV transmitter 220 performs receiver functionality and then transmits its received signal to the local tower dish 212.

In even other embodiments, the HDTV transmitter 220 employs the satellite earth station 222 to communicate to the satellite 250 via a wireless communication channel. The satellite 250 is able to communicate with a local satellite dish 213; the local satellite dish 213 communicatively couples to the HDTV set top box receiver 210 via a coaxial cable. This path of transmission shows yet another communication path by which the HDTV set top box receiver 210 may communicate with the HDTV transmitter 220.

In whichever embodiment and whichever signal path the HDTV transmitter 220 employs to communicate with the HDTV set top box receiver 210, the HDTV set top box receiver 210 is operable to receive communication transmissions from the HDTV transmitter 220.

The HDTV transmitter 220 includes an embodiment of the encoder 112 described above. Again, the encoder 112 is a closure operable encoder. Similarly, the HDTV set top box receiver 210 includes an embodiment of the decoder 122 described above. Cooperatively, the encoder 112 and the decoder 122 form a codec according to the invention.

The FIG. 2 shows yet another of the many embodiments where a closure operable encoder may be implemented according to the invention.

Figure 3:
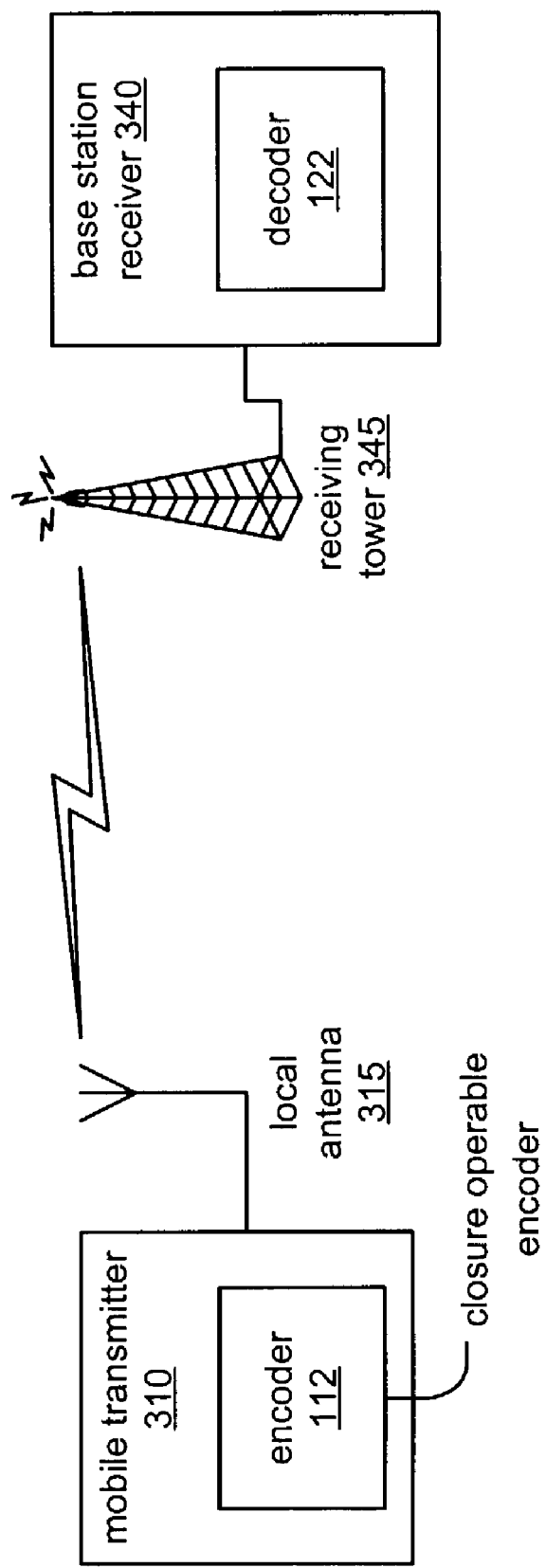
FIG. 3 is a system diagram illustrating an embodiment of a cellular communication system that is built according to the invention.

FIG. 3 is a system diagram illustrating an embodiment of a cellular communication system 300 that is built according to the invention. A mobile transmitter 310 includes a local antenna 315 communicatively coupled thereto. The mobile transmitter 310 may be any number of types of transmitters including a cellular telephone, a wireless pager unit, a mobile computer having transmit functionality, or any other type of mobile transmitter. The mobile transmitter 310 transmits a signal, using its local antenna 315, to a receiving tower 345 via a wireless communication channel. The receiving tower 345 is communicatively coupled to a base station receiver 340; the receiving tower 345 is operable to receive data transmission from the local antenna 315 of the mobile transmitter 310 that has been communicated via the wireless communication channel. The receiving tower 345 communicatively couples the received signal to the base station receiver 340.

The mobile transmitter 310 includes an embodiment of the encoder 112 described above. Again, the encoder 112 is a closure operable encoder. Similarly, the base station receiver 340 includes an embodiment of the decoder 122 described above. Cooperatively, the encoder 112 and the decoder 122 form a codec according to the invention.

The FIG. 3 shows yet another of the many embodiments where a closure operable encoder may be implemented according to the invention.

Figure 4:
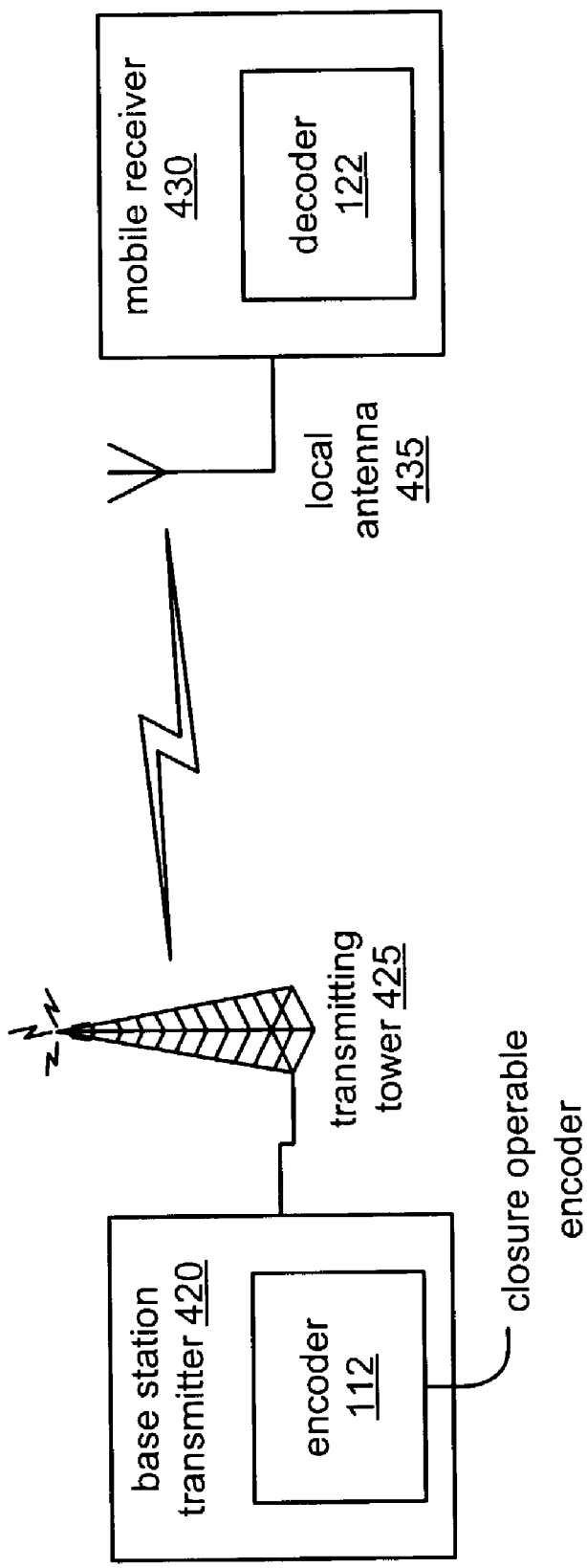
FIG. 4 is a system diagram illustrating another embodiment of a cellular communication system that is built according to the invention.

FIG. 4 is a system diagram illustrating another embodiment of a cellular communication system 400 that is built according to the invention. From certain perspectives, the cellular communication system 400 of the FIG. 4 may be viewed as being the reverse transmission operation of the cellular communication system 300 of the FIG. 3 where the mobile device includes a receiver and the base station device includes a transmitter.

A base station transmitter 420 is communicatively coupled to a transmitting tower 425. The base station transmitter 420, using its transmitting tower 425, transmits a signal to a local antenna 435 via a wireless communication channel. A mobile receiver 430 includes the local antenna 435 communicatively coupled thereto. The local antenna 435 is communicatively coupled to a mobile receiver 430 so that the mobile receiver 430 may receive transmission from the transmitting tower 435 of the base station transmitter 420 that have been communicated via the wireless communication channel. The local antenna 435 communicatively couples the received signal to the mobile receiver 430. It is noted that the mobile receiver 430 may be any number of types of receivers including a cellular telephone, a wireless pager unit, a mobile computer having receive functionality, or any other type of mobile receiver.

The base station transmitter 420 includes an embodiment of the encoder 112 described above (a closure operable encoder). Similarly, the mobile receiver 430 includes an embodiment of the decoder 122 described above. Cooperatively, the encoder 112 and the decoder 122 form a codec according to the invention.

The FIG. 4 shows yet another of the many embodiments where a closure operable encoder may be implemented according to the invention.

Figure 5:
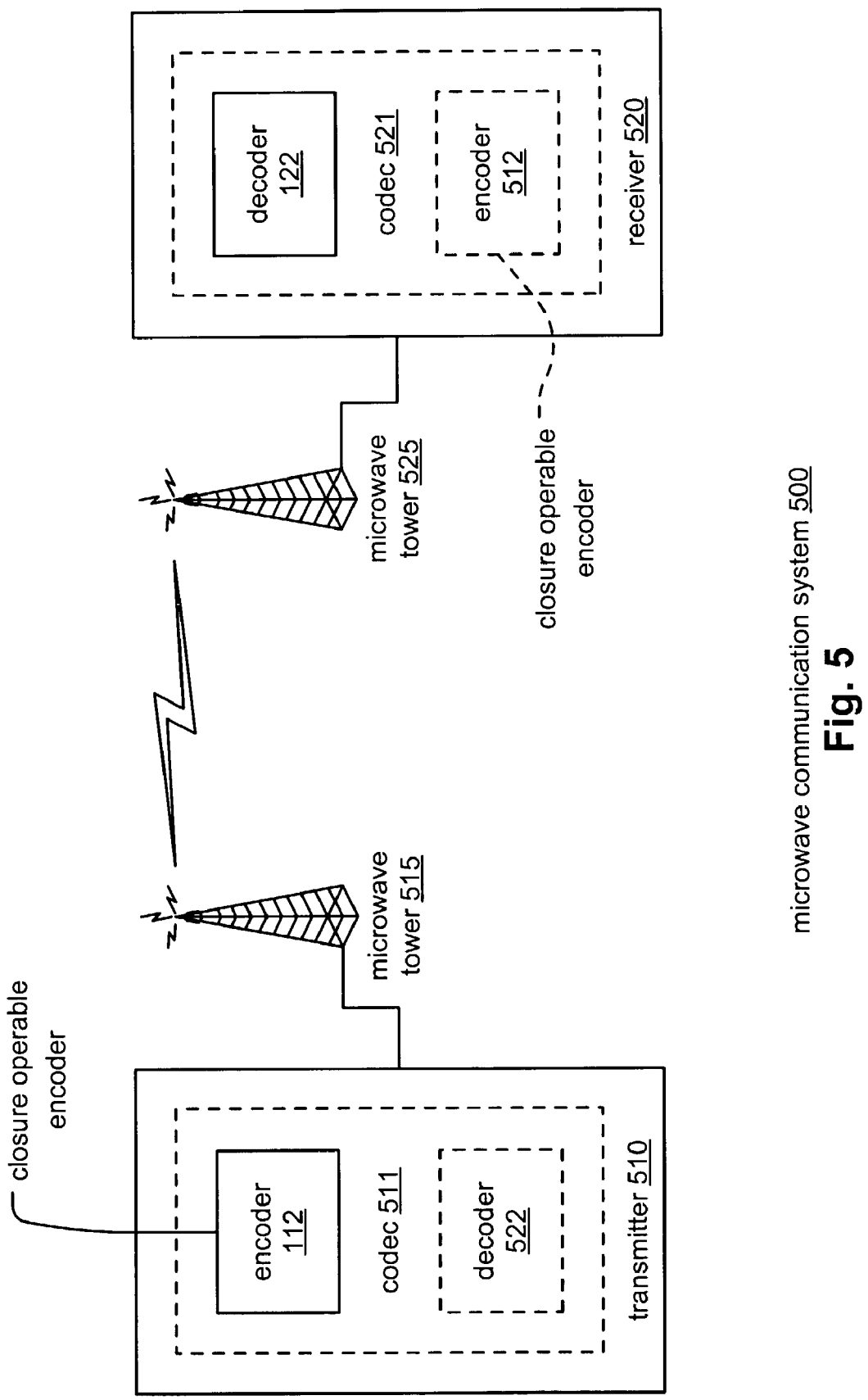
FIG. 5 is a system diagram illustrating an embodiment of a microwave communication system that is built according to the invention.

FIG. 5 is a system diagram illustrating an embodiment of a microwave communication system 500 that is built according to the invention. A transmitter 510 is communicatively coupled to a microwave tower 515. The transmitter 510, using its microwave tower 515, transmits a signal to a microwave tower 525 via a wireless communication channel. A receiver 520 is communicatively coupled to the microwave tower 525. The microwave tower 525 is able to receive transmissions from the microwave tower 515 that have been communicated via the wireless communication channel.

The transmitter 510 includes an embodiment of the encoder 112 described above (a closure operable encoder). Similarly, the receiver 520 includes an embodiment of the decoder 122 described above. Cooperatively, the encoder 112 and the decoder 122 form a codec according to a uni-directional communication implementation of the invention.

However, in a bi-directional communication implementation of the microwave communication system 500 of the FIG. 5, the transmitter 510 also includes an embodiment of a decoder 522; the embodiment of the decoder 522 may be viewed as being duplicative of the decoder 122 within the receiver 520. The encoder 112 and the decoder 522 together form a codec 511 within the transmitter 510. The receiver 520 also includes an embodiment of an encoder 512; the embodiment of the encoder 512 may be viewed as being duplicative of the encoder 112 within the transmitter 510. For example, the encoder 512 is a closure operable encoder as well. The decoder 122 and the encoder 512 together form a codec 521 within the receiver 520.

The embodiment of the invention described within the FIG. 5 shows an embodiment where a codec, built according to the invention, may be viewed as within a single device (such as the codec 511 within the transmitter 510 or the codec 521 within the receiver 520) or as being distributed across two separate devices, namely, the transmitter 510 and the receiver 520.

The FIG. 5 shows yet another of the many embodiments where one or more closure operable encoders may be implemented according to the invention.

Figure 6:
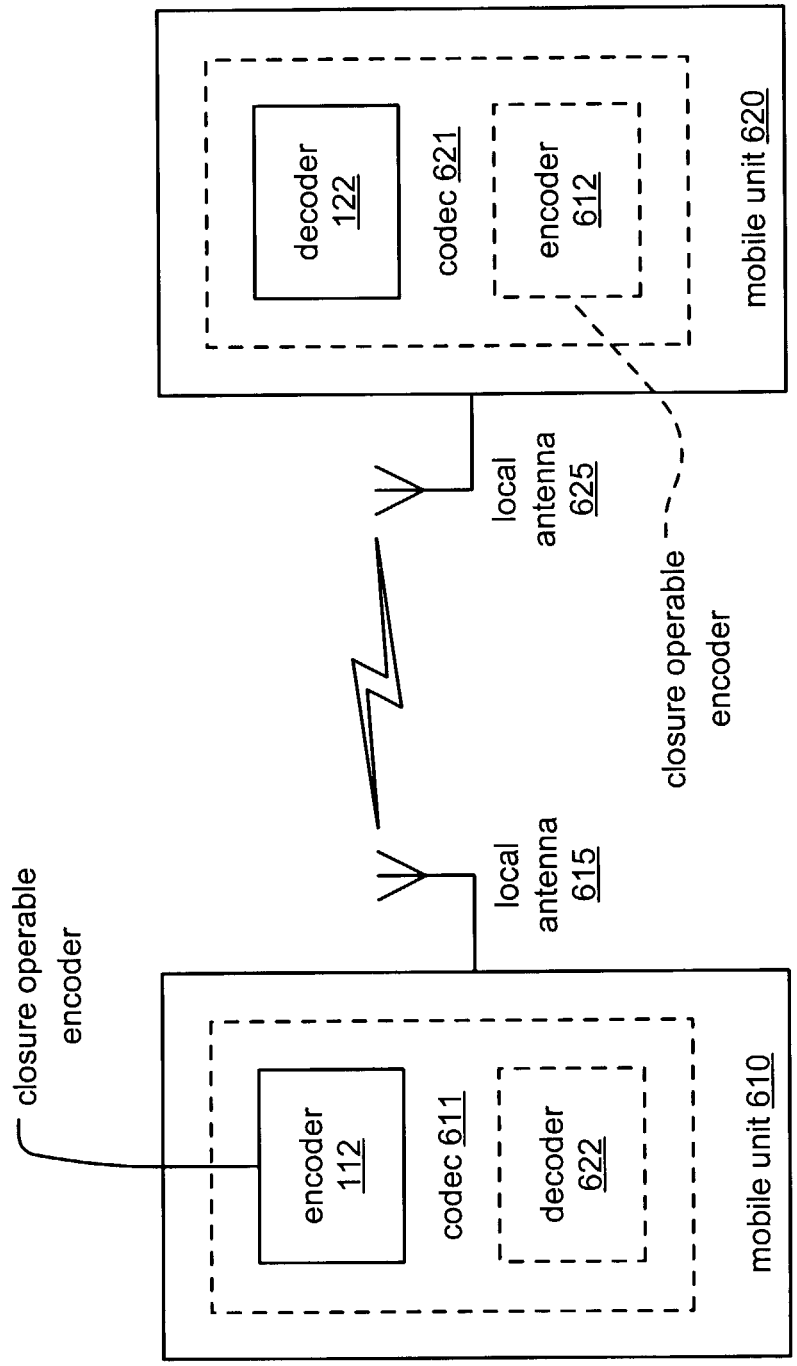
FIG. 6 is a system diagram illustrating an embodiment of a point-to-point radio communication system that is built according to the invention.

FIG. 6 is a system diagram illustrating an embodiment of a point-to-point radio communication system 600 that is built according to the invention. A mobile unit 610 includes a local antenna 615 communicatively coupled thereto. The mobile unit 610, using its local antenna 615, transmits a signal to a local antenna 625 via a wireless communication channel. A mobile unit 620 includes the local antenna 625 communicatively coupled thereto. The mobile unit 620 may receive transmissions from the mobile unit 610 that have been communicated via the wireless communication channel.

The mobile unit 610 includes an embodiment of the encoder 112 described above (closure operable encoder). Similarly, the mobile unit 620 includes an embodiment of the decoder 122 described above. Cooperatively, the encoder 112 and the decoder 122 form a codec according to a uni-directional communication implementation of the invention.

However, in a bi-directional communication implementation of the point-to-point radio communication system 600 of the FIG. 6, the mobile unit 610 also includes an embodiment of a decoder 622; the embodiment of the decoder 622 may be viewed as being duplicative of the decoder 122 within the mobile unit 620. The encoder 112 and the decoder 622 together form a codec 611 within the mobile unit 610. The mobile unit 620 also includes an embodiment of an encoder 612; the embodiment of the encoder 612 may be viewed as being duplicative of the encoder 112 within the mobile unit 610. For example, the encoder 612 is a closure operable encoder. The decoder 122 and the encoder 612 together form a codec 621 within the mobile unit 620.

The embodiment of the invention described within the FIG. 6 shows an embodiment where a codec, built according to the invention, may be viewed as within a single device (such as the codec 611 within the mobile unit 610 or the codec 621 within the mobile unit 610) or as being distributed across two separate devices, namely, the mobile unit 610 and the mobile unit 620.

The FIG. 6 shows yet another of the many embodiments where one or more closure operable encoders may be implemented according to the invention.

Figure 7:
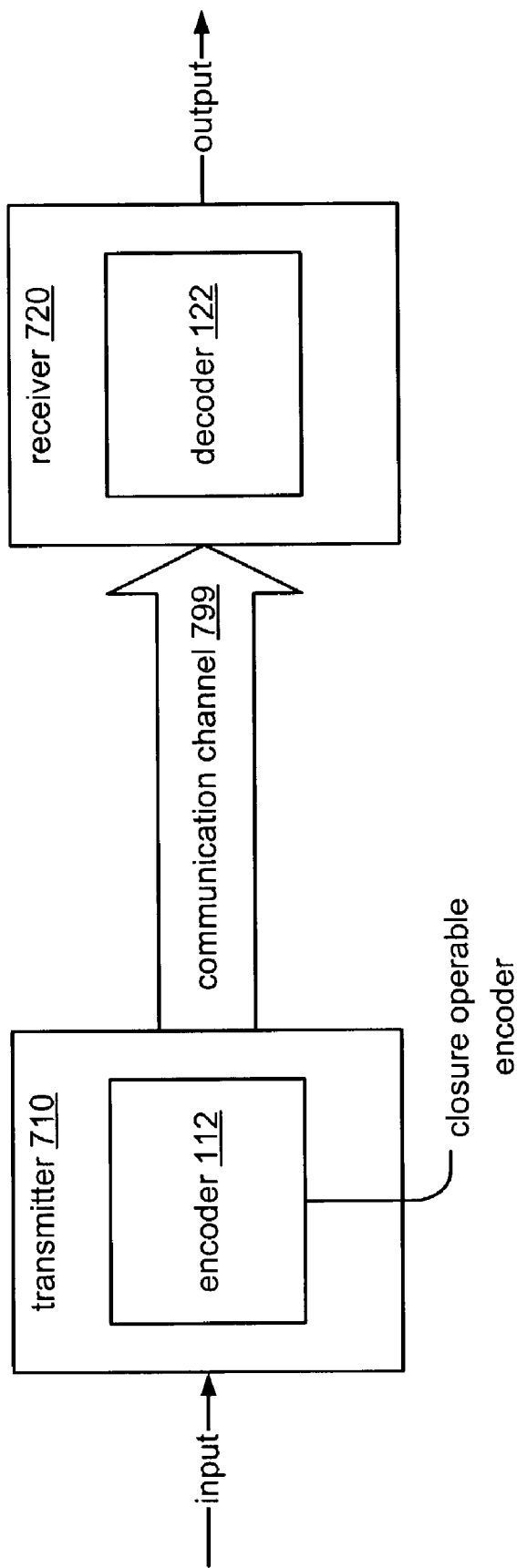
FIG. 7 is a system diagram illustrating an embodiment of a uni-directional communication system that is built according to the invention.

FIG. 7 is a system diagram illustrating an embodiment of a uni-directional communication system 700 that is built according to the invention. A transmitter 710 communicates with a receiver 720 via a uni-directional communication channel 799. The uni-directional communication channel 799 may be a wireline (or wired) communication channel or a wireless communication channel without departing from the scope and spirit of the invention. The wired media by which the uni-directional communication channel 799 may be implemented are varied, including coaxial cable, fiber-optic cabling, and copper cabling, among other types of "wiring." Similarly, the wireless manners in which the uni-directional communication channel 799 may be implemented are varied, including satellite communication, cellular communication, microwave communication, and radio communication, among other types of wireless communication.

The transmitter 710 includes an embodiment of the encoder 112. The encoder 112 is a closure operable encoder. Cooperatively, the encoder 112 and the decoder 122 form a codec according to the invention.

The FIG. 7 shows yet another of the many embodiments where a closure operable encoder may be implemented according to the invention.

Figure 8:
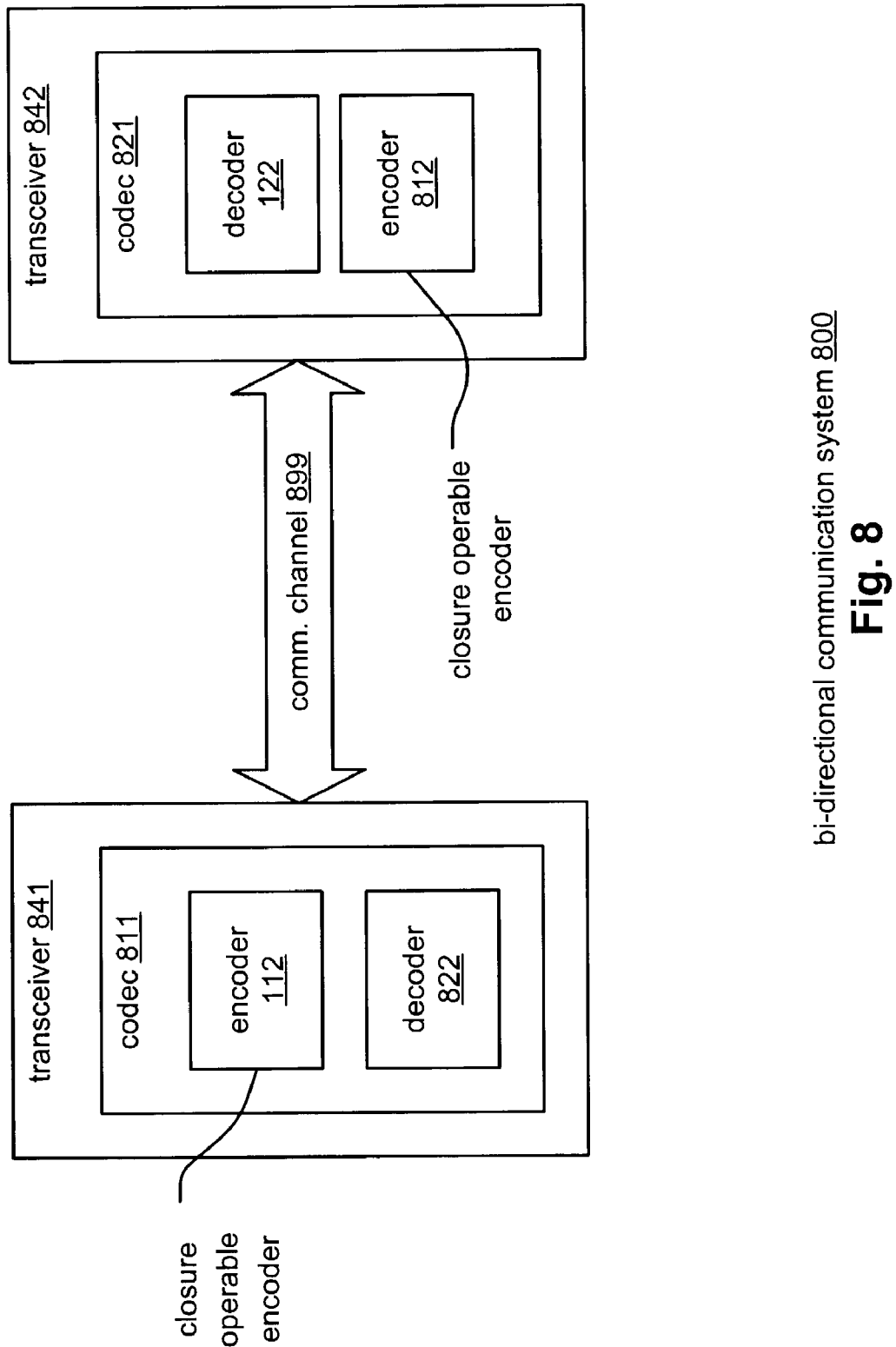
FIG. 8 is a system diagram illustrating an embodiment of a bi-directional communication system that is built according to the invention.

FIG. 8 is a system diagram illustrating an embodiment of a bi-directional communication system 800 that is built according to the invention. A transceiver 841 and a transceiver 842 are able to communicate with one another via a bi-directional communication channel 899. The bi-directional communication channel 899 may be a wireline (or wired) communication channel or a wireless communication channel without departing from the scope and spirit of the invention. The wired media by which the bi-directional communication channel 899 may be implemented are varied, including coaxial cable, fiber-optic cabling, and copper cabling, among other types of "wiring." Similarly, the wireless manners in which the bi-directional communication channel 899 may be implemented are varied, including satellite communication, cellular communication, microwave communication, and radio communication, among other types of wireless communication.

The transceiver 841 includes a codec 811 that includes an encoder 112 and a decoder 822. Similarly, transceiver 842 includes a codec 821 that includes a decoder 122 and an encoder 812. The codec 811 and the codec 821 may be viewed as being duplicative of one another within the transceivers 841 and 842.

Each of the encoders 112 and 812 are closure operable encoders. The FIG. 8 shows yet another of the many embodiments where one or more closure operable encoders may be implemented according to the invention.

Figure 9:
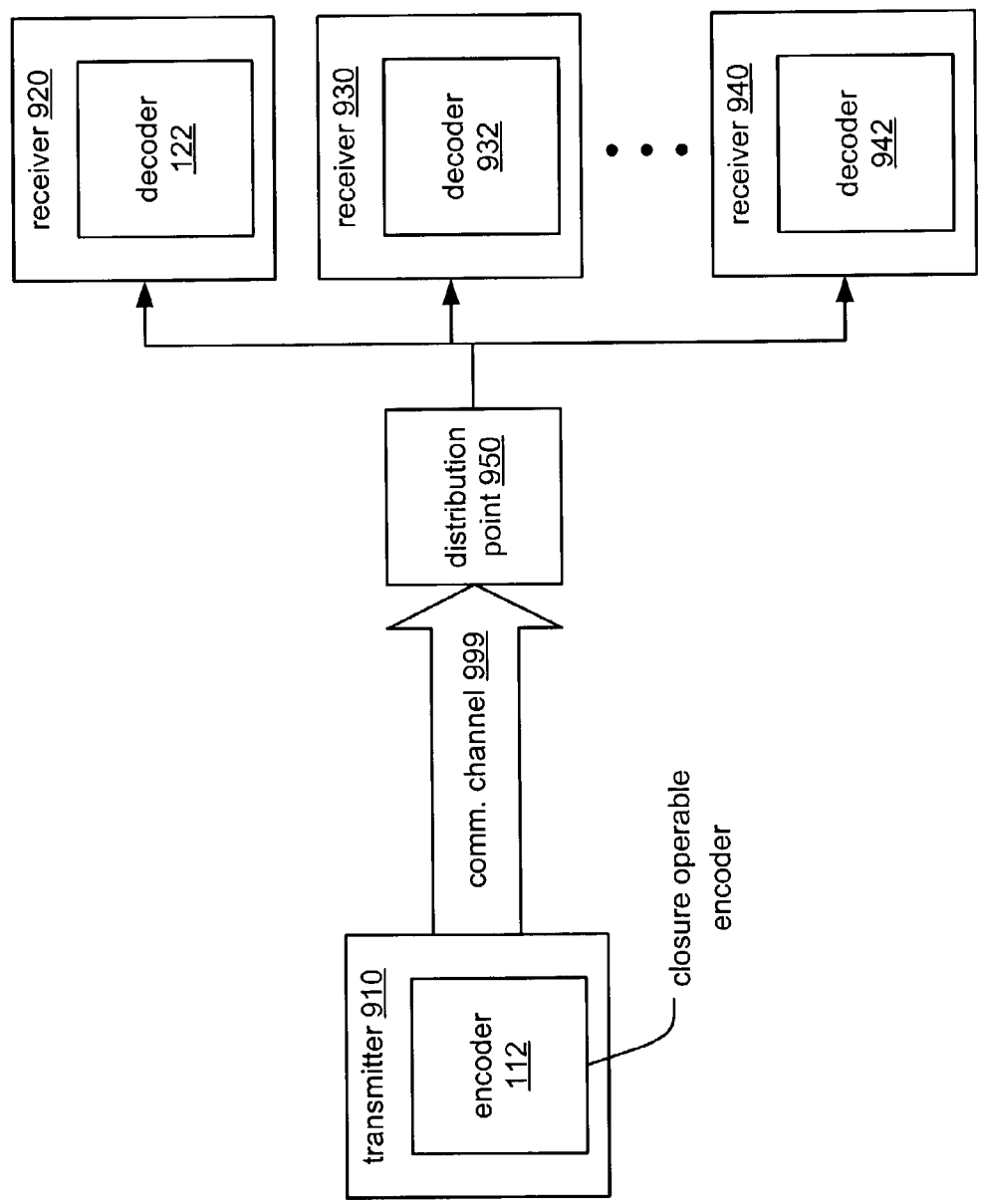
FIG. 9 is a system diagram illustrating an embodiment of a one to many communication system that is built according to the invention.

FIG. 9 is a system diagram illustrating an embodiment of a one to many communication system 900 that is built according to the invention. A transmitter 910 is able to communicate, via broadcast in certain embodiments, with a number of receivers, shown as receivers 910, 920, . . . , and 940 via a uni-directional communication channel 999. The uni-directional communication channel 999 may be a wireline (or wired) communication channel or a wireless communication channel without departing from the scope and spirit of the invention. The wired media by which the bi-directional communication channel 999 may be implemented are varied, including coaxial cable, fiber-optic cabling, and copper cabling, among other types of "wiring." Similarly, the wireless manners in which the bi-directional communication channel 999 may be implemented are varied, including satellite communication, cellular communication, microwave communication, and radio communication, among other types of wireless communication.

A distribution point 950 is employed within the one to many communication system 900 to provide the appropriate communication to the receivers 910, 920, . . . , and 940. In certain embodiments, the receivers 910, 920, . . . , and 940 each receive the same communication and individually discern which portion of the total communication is intended for themselves.

The transmitter 910 includes an embodiment of the encoder 112 (a closure operable encoder). Similarly, each of the receivers 910, 920, . . . , and 940 includes an embodiment of the decoder; specifically, the receiver 920 includes an embodiment of the decoder 122; the receiver 930 includes an embodiment of the decoder 932; and the receiver 940 includes an embodiment of the decoder 942. Cooperatively, the encoder 112 and each of the decoders 122, 932, . . . , and 942 form codecs according to the invention.

The FIG. 9 shows yet another of the many embodiments where a closure operable encoder may be implemented according to the invention.

Figure 10:
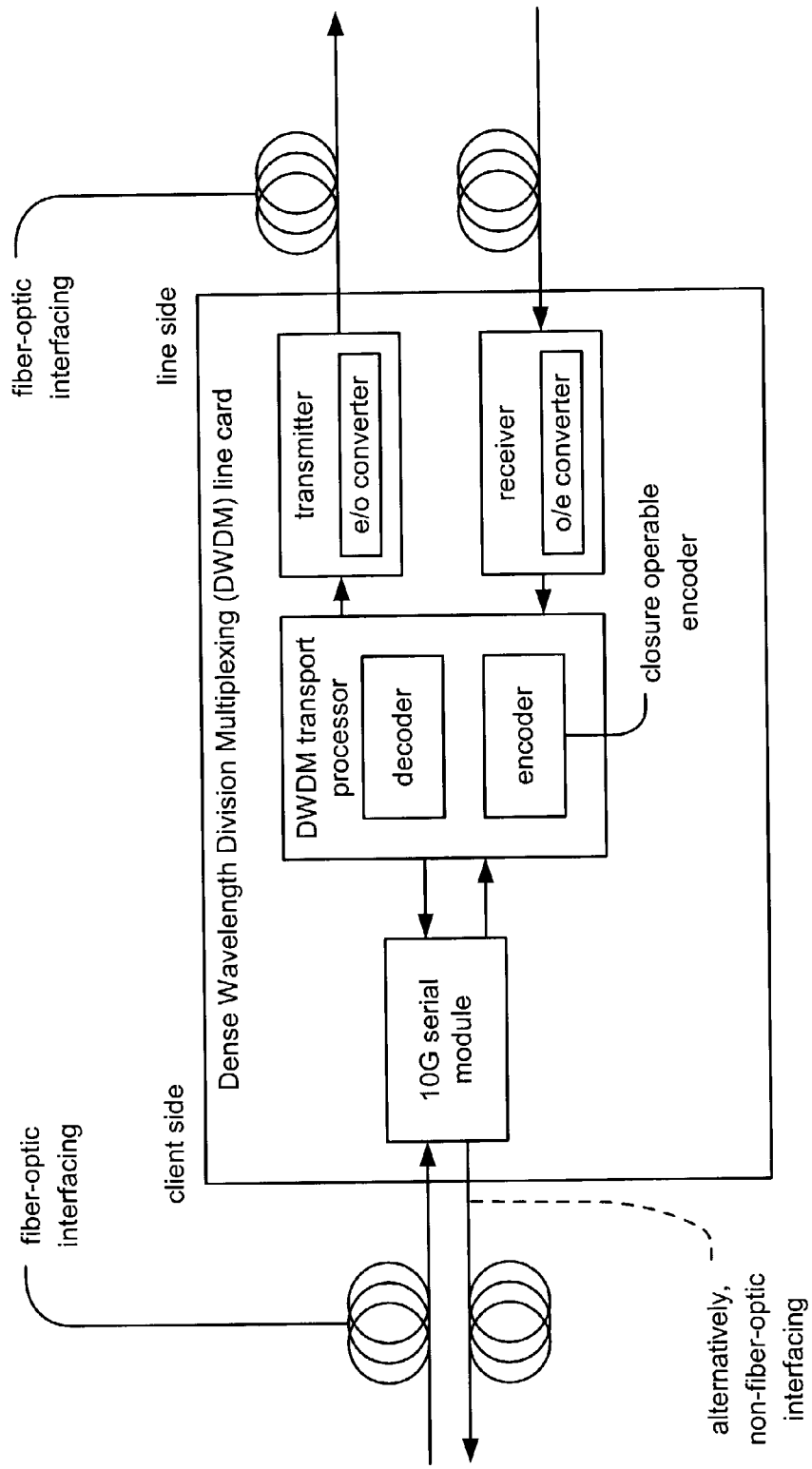
FIG. 10 is a system diagram illustrating an embodiment of a fiber-optic communication system that is built according to the invention.

FIG. 10 is a system diagram illustrating an embodiment of a fiber-optic communication system that is built according to the invention. The fiber-optic communication system includes a closure operable encoder according to the invention. The fiber-optic communication system includes a Dense Wavelength Division Multiplexing (DWDM) line card that is interposed between a line side and a client side.

DWDM is a technology that has gained increasing interest recently. From both technical and economic perspectives, the ability to provide potentially unlimited transmission capacity is the most obvious advantage of DWDM technology. The current investment already made within fiber-optic infrastructure can not only be preserved when using DWDM, but it may even be optimized by a factor of at least 32. As demands change, more capacity can be added, either by simple equipment upgrades or by increasing the number of wavelengths (lambdas) on the fiber-optic cabling itself, without expensive upgrades. Capacity can be obtained for the cost of the equipment, and existing fiber plant investment is retained. From the bandwidth perspective, some of the most compelling technical advantage of DWDM can be summarized as follows:

The transparency of DWDM: Because DWDM is a physical layer architecture (PHY), it can transparently support both time division multiplexing (TDM) and data formats such as asynchronous transfer mode (ATM), Gigabit Ethernet, ESCON, and Fibre Channel with open interfaces over a common physical layer.

The scalability of DWDM: DWDM can leverage the abundance of dark fiber (presently installed yet unused optical fiber) in many metropolitan area and enterprise networks to quickly meet demand for capacity on point-to-point links and on spans of existing SONET/SDH rings.

The dynamic provisioning capabilities of DWDM: the fast, simple, and dynamic provisioning of network connections give providers the ability to provide high-bandwidth services in days rather than months.

Fiber-optic interfacing is employed at each of the client and line sides of the DWDM line card. The DWDM line card includes a DWDM transport processor that includes functionality to support DWDM long haul transport, DWDM metro transport, next-generation SONET/SDH multiplexers, digital cross-connects, and fiber-optic terminators and test equipment.

On the line side, the DWDM line card includes a transmitter that is operable to perform electrical to optical conversion for interfacing to an optical medium, and a receiver that is operable to perform optical to electrical conversion for interfacing from the optical medium. On the client side, the DWDM line card includes a 10G serial module. That is operable to communicate with any other devices on the client side of the fiber-optic communication system using a fiber-optic interface. Alternatively, the interface may be implemented using non-fiber-optic media, including copper cabling and/or some other type of interface medium.

The DWDM transport processor of the DWDM line card includes a decoder that is used to decode received signals from either one or both of the line and client sides and an encoder that is used to encode signals to be transmitted to either one or both of the line and client sides. The encoder implemented within the DWDM transport processor is a closure operable encoder. The FIG. 10 shows yet another of the many embodiments where a closure operable encoder may be implemented according to the invention.

Figure 11:
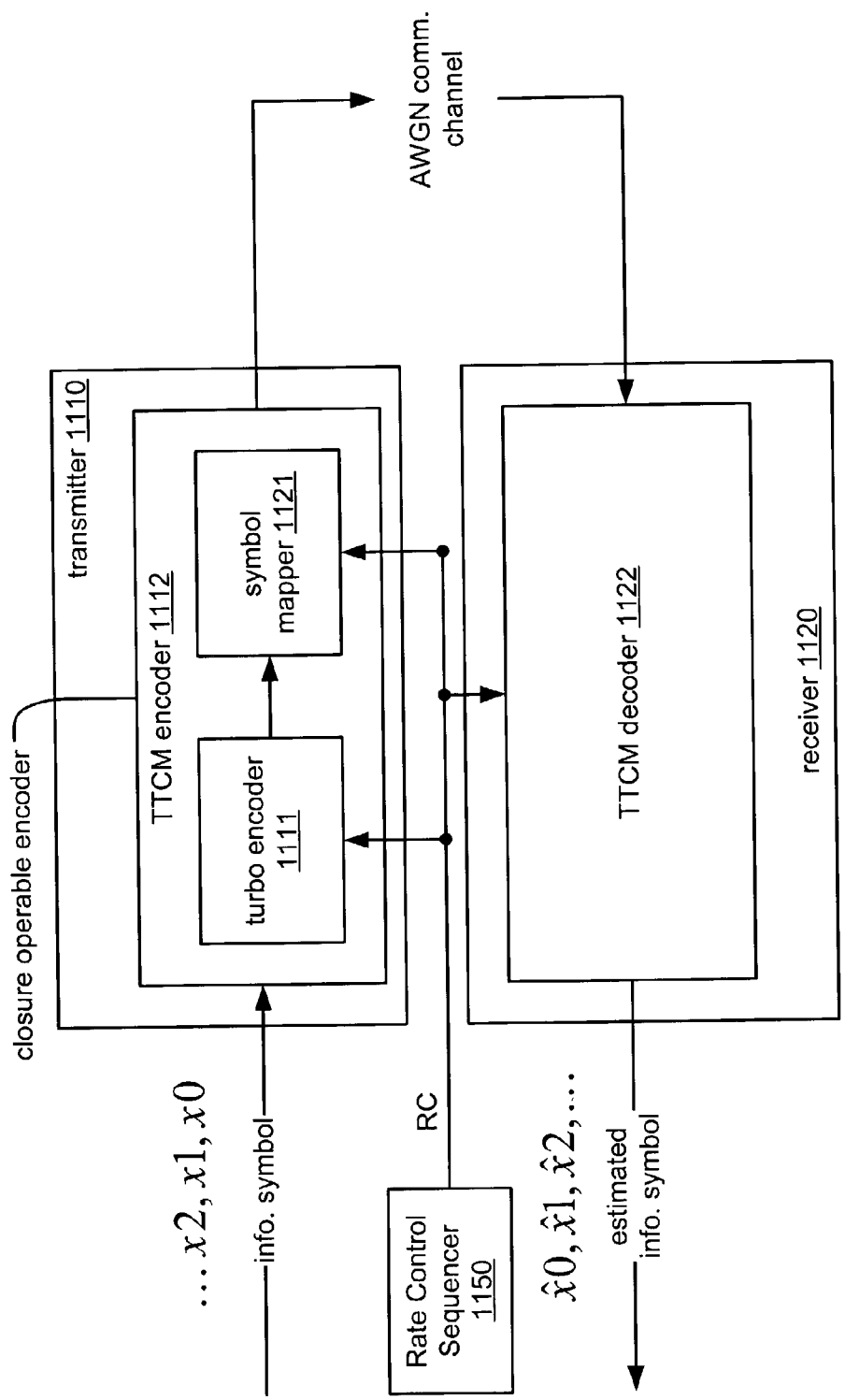
FIG. 11 is a system diagram illustrating an embodiment of a Turbo Trellis Coded Modulation (TTCM) communication system that is built according to the invention.

FIG. 11 is a system diagram illustrating an embodiment of a Turbo Trellis Coded Modulation (TTCM) communication system that is built according to the invention. The TTCM communication system includes a transmitter 1110 and a receiver 1120 that are communicatively coupled to one another via a communication channel that introduces Additive White Gaussian Noise (AWGN) to the signal. The communication channel may be wireline or wireless according to the invention. The AWGN communication channel may be viewed as being a relatively noisy communication channel.

The transmitter 1110 includes a TTCM encoder 1112 that encodes one or more information symbols and then modulates those encoded symbols according to a constellation and a mapping. The transmitter 1110 then prepares this signal for transmission across the communication channel. At the other end of the communication channel, the receiver 1120 includes a TTCM decoder 1122 that receives and estimates the encoded symbols that have been transmitted across the communication channel.

In addition, a rate control sequencer 1150 provides one or more rate controls to the turbo encoder 1111 and the symbol mapper 1121 of the TTCM encoder 1112 and to the TTCM decoder 1122. This rate control sequencer 1150 provides rate control sequences (which may include as few as one rate control (RC) and as many as several RCs). Each RC includes one or more modulations (constellations and mappings). Each modulation provides a bandwidth efficiency that may be viewed as being a total number of information bits per symbol that is encoded; a number of redundancy bits contained therein. Each of the TTCM encoder 1112 and the TTCM decoder 1122 is operable to cycle through the rate control sequence at their respective locations when performing encoding and decoding of symbols, respectively.

Generally speaking within the TTCM encoder 112, the turbo encoder 1111 performs the symbol encoding and the symbol mapper 1121 maps those encoded symbols to the appropriate modulation according to the rate control sequence provided by the rate control sequencer 1150. Similarly, generally speaking within the TTCM decoder 1122, the TTCM decoder 1122 performs calculations that are employed to perform decoding of the received symbols according to the rate control sequence provided by the rate control sequencer 1150. There are a whole host of various embodiments in which various modulations (having various modulations and various mappings), and various periodic sequencing of rate control sequence may be used to perform the encoding and decoding of data using the TTCM techniques described herein. In some embodiments, the rate control sequence is adaptively changed during operation to provide for improved performance. In other embodiments, predetermined rate control sequences are employed.

In adaptive embodiments, certain operating conditions may be employed, such as a measurement of the communication channel's SNR, to direct the changing of the rate control sequence or rate control sequences to be used by both the TTCM encoder 1112 and the TTCM decoder 1122. It is understood that either one or both of the TTCM encoder 1112 and the TTCM decoder 1122 may perform the measurement of such operating conditions and direct the TTCM communication system to change rate control sequences. In some embodiments, such as a uni-directional communication system embodiment, it may make more sense for the transmitter to perform such measurement and direction, whereas within bi-directional communication system embodiments, either of the transceivers may provide such functionality. The particular implementation may be left to one who implements the invention in a particular application.

It is also understood that a variety of means of modulation, transmission, receipt, and demodulation may be performed to generate the analog signals to be transmitted across the communication channel without departing from the scope and spirit thereof. Each and any such means may be practiced according to the invention while performing the TTCM encoding/decoding described herein.

Figure 12:
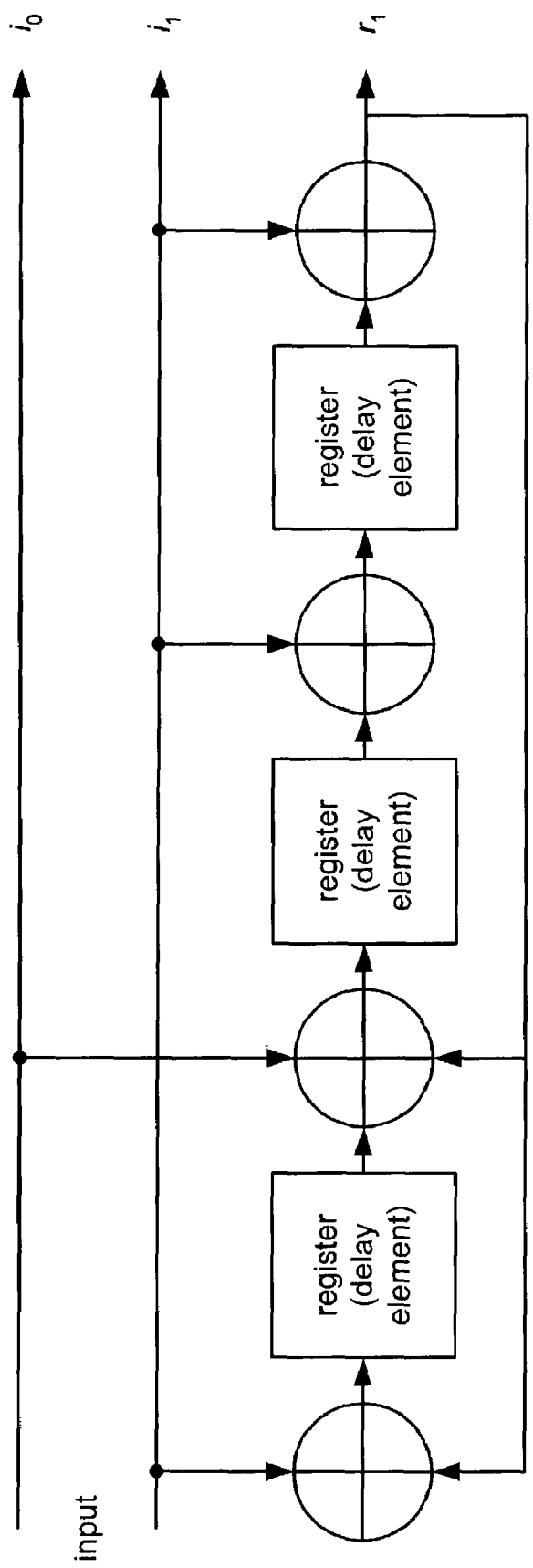
FIG. 12 is a diagram illustrating an embodiment of a rate ⅔ (13/11) encoder that is built according to the invention.

FIG. 12 is a diagram illustrating an embodiment of a rate ⅔ (13/11) encoder that is built according to the invention. The FIG. 12 shows a 3 register/8 state encoder that receives 2 bits as input (which may be referred to as a 2 bit input symbol). The encoder of the FIG. 12 inputs these two bit input symbols and outputs the bits, $i_0 i_1 r_1$, that compose the output symbols the $i_0 i_1$ bits may be referred to as the information bits and the $r_1$ bit maybe referred to as a coded bit that is coded using delayed versions of the $i_0 i_1$ bits.

The impulse response state sequence of the encoder is first determined. Referring to the FIG. 12, with consider a 3 register/8 state and 2-bit symbol input convolution encoder. When a sequence comprising 2, 0, 0, . . . , which is called an MSB impulse sequence, is provided to the encoder, then the impulse response state of the encoder at time i is denoted by $I_m(i-1)$. In looking at the impulse response states of the encoder, the definition of the $I_l(i-1)$ as being the i-th impulse response state of the encoder with the input LSB impulse sequence of 1, 0, 0, . . . . The convolutional encoder is a linear device. Therefore, by the linearity of the state of the encoder, the impulse response state sequences of the encoder, represented as $I_m(0)$, $I_m(1)$, . . . and $I_l(0)$, $I_f(1), \ldots$, and then periodic with the period 7, or m−1, where m is equal to the number of states of the encoder.

For example, referring to the encoder of the FIG. 12, the encoder is a rate ⅔ encoder (13,11) whose impulse response state vectors may be represented as follows:

$$
\begin{array}{lll}
I_m(0) = (010) & I_l(0) = (100) & \text{(EQ 1)} \\
I_m(1) = (011) & I_l(1) = (110) & \\
I_m(2) = (111) & I_l(2) = (101) & \\
I_m(3) = (001) \quad \text{and} & I_l(3) = (010) & \\
I_m(4) = (100) & I_l(4) = (011) & \\
I_m(5) = (110) & I_l(5) = (111) & \\
I_m(6) = (101) & I_l(6) = (001) &
\end{array}
$$

$I_m(i)=I_m(i \bmod(7))$ and $I_f(i)=I_f(i \bmod(7))$ for $i=7,8,$

This encoder described above is an 8-state/3 register encoder. However, the principles described herein may be applied to any $2^x$-state/x register encoder without departing from the scope and spirit of the invention.

After these impulse response states of the encoder are assessed, then an accurate determination of which inputs need be provided to the encoder to force the proper encoder state transitions may be made. Determining these impulse response state responses of the encoder are a first step in determining which inputs are necessary to control the transitioning of states of the encoder to return the encoder to a predetermined state. In some embodiments, this transitioning in controlled so that the encoder returns to the predetermined state at the end of each data frame of symbols that the encoder is to encode.

To close the encoder (return the encoder to the predetermined state), we suppose a 2-bit symbol sequence $(u_{m,0},u_{1,0}), \ldots, (u_{m,N-1},u_{l,N-1})$ that is sent to the $2^x$-state/x register and 2-bit input convolution encoder with the impulse response states, shown as $I_m(i)$ and $I_f(i)$, then the final state of the encoder may be shown as follows:

$$\sum_{i=0}^{N-1} \left( u_{m,i} I_m((N-i-1) \bmod(2^x-1)) + u_{l,i} I_l((N-i-1) \bmod(2^x-1)) \right)$$

This final state of the encoder may be shown as follows, by the definition of $I_m(i)$, it is clear that by sending a 2-bit sequence with all 0s except at the position i where $(u_{m,i},0)$ is sent, then the final state at time N is $I_m(N-i-1)$. Similarly, by sending a 2-bit sequence with all 0s except at the position i where $(u_{l,i},0)$ is sent, then the final state at time N is $I_f(N-i-1)$. Then, by the linearity of the state of the convolutional encoder, the final state may be shown as follows:

$$\sum_{i=0}^{N-1} \left( u_{m,i} I_m((N-i-1)) + u_{l,i} I_l((N-i-1)) \right)$$

The proposition follows this conclusion and the periodic property of $I_m(i)$ and $I_f(i)$ as well. The determination of impulse response state transitions and final impulse response state of an encoder may be summarized as follows:

If any binary x bit vector can be linearly represented by the 2M impulse response state vectors, $I_m(0), I_f(0), \ldots, I_m(M-1), I_f(M-1)$, of $2^x$ states and 2 bit input symbols provided to the convolutional encoder, then this encoder can be closed (returned to a predetermined state) by padding (appending to the end of a date frame) M extra 2 bit symbols to the information sequence.

This property may be shown as follows: given any 2 bit sequence $(u_{m,0},u_{l,0}), \ldots, (u_{m,L-M-1},u_{l,L-M-1})$ of length L−M, then by padding another M extra symbols such that $(u_{m,L-M+1},u_{l,L-M+1})=(0,0), \ldots$, i=0, $\ldots$, M−1, to the sequence will return the encoder to the predetermined state.

The next step involves sending the size L sequence $(u_{m,0},u_{l,0}), \ldots, (u_{m,L-1},u_{l,L-1})$ to the encoder. Within the notation, we let S be the final state of the encoder, which is a 3 bit binary vector. Then, there will exist 2M bits, that may be represented as $b_{m,0}, b_{l,0}, \ldots, b_{m,M-1}, b_{l,M-1}$, such that the final state of the encoder, S, may be represented as follows:

$$S = \sum_{i=0}^{M-1} \left( b_{m,i} I_m(i) + b_{l,i} I_l(i) \right) \quad \text{(EQ 2)}$$

However, on the other hand, if the block 2 bit sequence L, represented as $0, \ldots, 0, (b_{m,M-1},b_{l,M-1}), \ldots, (b_{m,0},b_{l,0})$, is sent to the constituent encoders, then the final state of the encoder, S, may be represented as follows:

$$S = \sum_{i=0}^{M-1} \left( b_{m,i} I_m(i) + b_{l,i} I_l(i) \right) \quad \text{(EQ 3)}$$

Then, by using the Equations 2 and 3, and by the linearity of the states of the convolutional encoder, by sending the following sequence to the encoder:

$$[(u_{m,0},u_{l,0}), \ldots, (u_{m,L-M-1},u_{l,L-M-1})]+[0 \ldots, 0,$$
$$(b_{m,M-1},b_{l,M-1}), (b_{m,0},b_{l,0})]=(u_{m,0},u_{1,0}), \ldots,$$
$$(u_{m,L-M-1},u_{l,L-M-1}), (b_{m,M-1},b_{l,M-1}), \ldots, (b_{m,0},$$
$$b_{l,0})$$

then the final state for both encoders will be the predetermined state, which is the 0 state in this embodiment.

In addition, when considering the convolutional encoder within the FIG. 12, it is found that among the 4 impulse response vectors, $I_m(0), I_f(0), I_m(1), I_f(1)$, then the first 3 of the impulse response vectors, $I_m(0), I_f(0), I_m(1)$, are all linearly independent as well. Therefore, any 3 bit vector may be linearly represented by these impulse response vectors, $I_m(0), I_f(0), I_m(1), I_f(1)$. In order to make the final encoder state forced to the predetermined state, which may be the 0 state in some embodiments, it is sufficient to pad only 2 symbols to any information sequence. This constitutes a reduction from the three symbols that are required in the prior art approach of padding 3 zero valued symbols to the end of a data frame to force the encoder state to the predetermined state. This includes a savings of 1 symbol per data frame. When considered over a multitude of data frames, a savings of one symbol may provide for a great savings in bandwidth and significantly increase throughput within a communication system employing the closure operable functionality provided by the invention.

Figure 13:
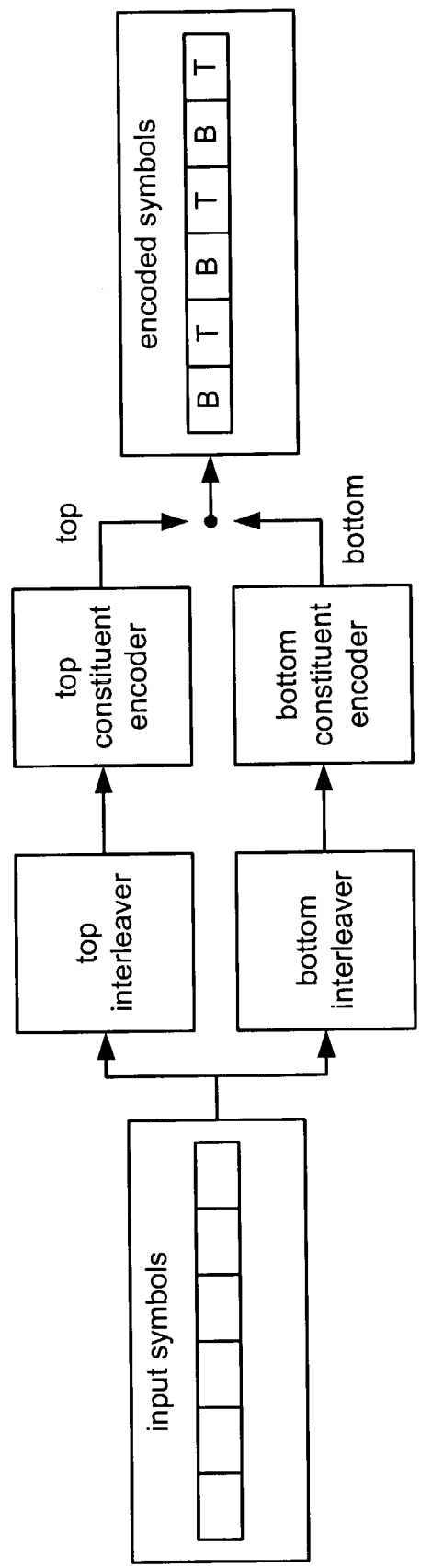
FIG. 13 is a diagram illustrating an embodiment of a turbo encoder that is built according to the invention.

FIG. 13 is a diagram illustrating an embodiment of a turbo encoder that is built according to the invention. The FIG. 13 shows a novel turbo encoder that receives as input a number of symbols. These input symbols are simultaneously provided to a top path and a bottom path. The top path includes a top interleaver and a top constituent encoder; the bottom path includes a bottom interleaver and a bottom constituent encoder. The outputs from the top and bottom paths are alternatively selected and provided as output, as shown as encoded symbols.

Within the FIG. 13, the interleaving of the top and bottom interleavers may be represented as follows:

$\pi=(\pi_m,\pi_l)$ is used to represent the 2 bit interleaver of the FIG. 13. When a 2 bit input symbol sequence, $(u_{m,0},u_{l,0}), \ldots, (u_{m,N-1},u_{l,N-1})$, is provided to a $2^x$ state/x register encoder (one example would be an 8 state/3 register) encoder and 2 bit input convolutional encoder with the interleaver, then the interleaved sequence may be represented as follows: $(v_{m,0},v_{l,0}), \ldots, (v_{m,L-M-1},v_{l,L-M-1})$. After performing this interleaving operation, then the final state of the encoder may be shows as follows:

$$S = \sum_{i=0}^{N-1} u_{m,i} I_m\big((N-i-\pi_m(N-1-i))\bmod(2^x-1)\big) +$$
$$u_{l,i} I_l\big((N-i-\pi_l(N-1-i))\bmod(2^x-1)\big)$$

Within the turbo encoder of the FIG. 13, the two constituent encoders are the same ($2^x$ state/x register encoder and 2 bit input convolutional encoders), and each has the impulse response state sequences $I_m(i), I_l(i), i=0, \ldots, 2x$. The following notation is employed to represent the two interleavers of size L for the top and bottom interleaver that precede each of the top constituent encoder and the bottom constituent encoder, respectively.

$\pi_T=(\pi_{T,m},\pi_{T,l})$ is the interleaving for the top interleaver.
$\pi_B=(\pi_{B,m},\pi_{B,l})$ is the interleaving for the bottom interleaver.

Moreover, $\pi_{a,m}$ is the interleaving of the MSB, and $\pi_{a,l}$ is the interleaving of the LSB. The impulse response states of the turbo encoder of the FIG. 13 may be defined as follows:

$S_{T,l}(i)=I_l\lfloor(L-\pi_{T,l}(L-1-i)-1)\bmod(2^x-1)\rfloor$ $S_{T,m}(i)=I_m\lfloor(L-\pi_{T,m}(L-1-i)-1)\bmod(2^x-1)\rfloor$ These two equations are used to represent the interleaves for the top interleaver associated with the top constituent encoder (within the top path).

$S_{B,l}(i)=I_l\lfloor(L-\pi_{B,l}(L-1-i)-1)\bmod(2^x-1)\rfloor$ $S_{B,m}(i)=I_m\lfloor(L-\pi_{B,m}(L-1-i)-1)\bmod(2^x-1)\rfloor$ These two equations are used to represent the interleaves for the bottom interleaver associated with the bottom constituent encoder (within the bottom path).

By concatenating the top vector, $S_{T,l}(i)$, and the bottom vector, $S_{B,l}(i)$, the following 2x bit input vectors may be generated and represented as follows:

$T_l(i)=(S_{B,l}(i), S_{T,l}(i))$ and $T_m(i)=(S_{B,m}(i), S_{T,m}(i))$.

Any binary 2x bit vectors may be linearly represented by the 2M vectors shown follows: $T_m(0), T_l(0), T_m(1), T_l(1), \ldots, T_m(M-1), T_l(M-1)$. Therefore, the two constituent encoders in the turbo encoder of the FIG. 13 may be closed (forced to the predetermined state) by padding (and/or appending) M extra 2 bit symbols to the information sequence.

For example, given any 2 bit sequence, $(u_{m,0},u_{l,0}), \ldots, (u_{m,L-M-1},u_{l,L-M-1})$, of length L-M. By padding another M extra symbols, $(u_{m,L-M},u_{l,L-M}), \ldots, (u_{m,L-1},u_{l,L-1})$, such that $(u_{j,L-M+i},u_{l,L-M+i})=(0,0), i=0, \ldots, M-1$, to the information sequence, then the encoder may be forced to the predetermined state. Therefore, the size L sequence, $(u_{m,0},u_{l,0}), \ldots, (u_{m,L-1},u_{l,L-1})$, is interleaved with the top interleaver, $\pi_T$, and then passed to the top constituent encoder. Similarly, the same sequence is interleaved with the bottom interleaver, $\pi_B$, and then sent to the bottom constituent encoder. The final states of the top constituent encoder and the bottom constituent encoder are represented by $S_T$ and $S_B$. A 2x bit binary vector includes the states of both the top constituent encoder and the bottom constituent encoder and may be represented as $S=(S_B,S_T)$. There therefore exists 2M bits, shown as $b_{m,0},b_{l,0}, \ldots, b_{j,m-1}, b_{l,M-1}$, such that it will force the state of the turbo encoder to the following value:

$$S = \sum_{i=0}^{M-1} \big(b_{m,i}T_m(i) + b_{l,i}T_l(i)\big) \tag{EQ 4}$$

$$S = \sum_{i=0}^{M-1} \big(b_{m,i}[S_{B,m}(i), S_{T,m}(i)] + b_{l,i}[S_{B,m}(i), S_{T,m}(i)]\big)$$

However, if the block size L 2 bit sequence, shown as $0, \ldots, 0, (b_{m,M-1},b_{l,M-1}), \ldots, (b_{m,0},b_{l,0})$, is sent to the constituent encoder after undergoing the interleaving of the top interleaver, $\pi_T$, then the final state of the encoder may be shown as follows:

$$S = \sum_{i=0}^{M-1} b_{m,M-1-i} I_m\big((L-1-\pi_{T,m}(L-1-i))\bmod(2^x-1)\big) + \tag{EQ 5}$$
$$b_{l,M-1-i} I_l\big((N-i-\pi_{T,l}(N-1-i))\bmod(2^x-1)\big)$$

$$S = \sum_{i=0}^{M-1} \big(b_{m,i}S_{T,m}(i) + b_{l,i}S_{T,l}(i)\big)$$

Similarly, by sending the bit sequence, $0, \ldots, 0, (b_{m,M-1},b_{l,M-1}), \ldots, (b_{m,0},b_{l,0})$, through the bottom path, then the final state of the encoder, after having undergone the interleaving of the bottom interleaver, $\pi_B$, then the final state of the encoder may be shown as follows:

$$S = \sum_{i=0}^{M-1} b_{m,M-1-i} I_m\big((L-1-\pi_{B,m}(L-1-i))\bmod(2^x-1)\big) + \tag{EQ 6}$$
$$b_{l,M-1-i} I_l\big((N-i-\pi_{B,l}(N-1-i))\bmod(2^x-1)\big)$$

$$S = \sum_{i=0}^{M-1} \big(b_{m,i}S_{B,m}(i) + b_{l,i}S_{B,l}(i)\big)$$

By capitalizing on the linearity of the states of the encoder, then by sending the following bit sequence to the turbo encoder of the FIG. 13, it can be concluded that the encoder will be forced to the predetermined state. Specifically in this embodiment, the encoder will be forced to the state having the value of 0. The bit sequence to be sent to do this is shown as follows:

$\lfloor(u_{m,0},u_{l,0}), \ldots, (u_{m,L-1},u_{l,L-1})\rfloor+\lfloor 0, \ldots, 0, (b_{m,M-1},b_{l,M-1}), (b_{m,0},b_{l,0})\rfloor=(u_{m,0},u_{l,0}), \ldots, (u_{m,L-M-1},u_{l,L-M-1}), (b_{m,M-1},b_{l,M-1}), \ldots, (b_{m,0},b_{l,0})$ It is noted here that the states of BOTH the top constituent encoder and the bottom constituent encoder of the turbo encoder of the FIG. 13 will be forced to the state of 0.

As an example, when the interleaving of the top interleaver and the bottom interleaver are defined as follows:

$$\pi_{T,m} = \pi_{T,l} = \begin{pmatrix} 0 & 1 & 2 & 3 & 4 & 5 & 6 & 7 & 8 & 9 & 10 & 11 & 12 & 13 & 14 & 15 \\ 0 & 3 & 2 & 14 & 13 & 6 & 7 & 8 & 9 & 10 & 15 & 12 & 11 & 1 & 4 & 5 \end{pmatrix}$$

is the interleaving of the top interleaver, and $$\pi_{B,M} = \pi_{B,l} = \begin{pmatrix} 0 & 1 & 2 & 3 & 4 & 5 & 6 & 7 & 8 & 9 & 10 & 11 & 12 & 13 & 14 & 15 \\ 14 & 1 & 6 & 3 & 10 & 5 & 12 & 7 & 0 & 9 & 8 & 11 & 4 & 13 & 2 & 15 \end{pmatrix}$$

is the interleaving of the bottom interleaver.

Based on these interleaves, then $T_m(i)=(S_{B,m}(i), S_{T,m}(i))$ and $T_l(i)=(S_{B,l}(i),S_{T,l}(i))$ may be obtained as follows:

$T_m(0)=010100$
$T_l(0)=100011$
$T_m(1)=101011$
$T_l(1)=001110$
$T_m(2)=11101$
$T_l(2)=101010$
$T_m(3)=100001$
$T_l(4)=011010$

Since, the $\text{rank}(T_m(0)\ T_l(0)\ T_m(1)\ T_l(1)\ T_m(2)\ T_l(2))^{transpose}=5$, yet the $\text{rank}(T_m(0)\ T_l(0)\ T_m(1)\ T_l(1)\ T_m(2)\ T_l(2)\ T_m(3)\ T_l(3))^{transpose}=6$, then all 6 bit vectors can be linearly represented by the following vectors: $T_m(0)$, $T_l(0)$, ..., $T_m(3)$, $T_l(3)$. The following table may be used to show the relationship between the final state of the encoder, S. The octal and binary columns cooperatively represent the final state of the encoder, S. The output coefficient of the encoder is shown as the right column, $b_{m4}b_{14}b_{m3}b_{13}b_{m2}b_{12}b_{m1}b_{11}b_{m0}b_{10}$.

| octal | binary | $b_{m4}b_{14}b_{m3}b_{13}b_{m2}b_{12}b_{m1}b_{11}b_{m0}b_{10}$ |
|---|---|---|
| 0 | 000000 | 00000000 |
| 1 | 000001 | 00100100 |
| 2 | 000010 | 01000010 |
| 3 | 000011 | 01100110 |
| 4 | 000100 | 01001100 |
| 5 | 000101 | 01101000 |
| 6 | 000110 | 00001110 |
| 7 | 000111 | 00101010 |
| 10 | 001000 | 00000110 |
| 11 | 001001 | 00100010 |
| 12 | 001010 | 01000100 |
| 13 | 001011 | 01100000 |
| 14 | 001100 | 01001010 |
| 15 | 001101 | 01101110 |
| 16 | 001110 | 00001000 |
| 17 | 001111 | 00101100 |
| 20 | 010000 | 01001101 |
| 21 | 010001 | 01101001 |
| 22 | 010010 | 00001111 |
| 23 | 010011 | 00101011 |
| 24 | 010100 | 00000001 |
| 25 | 010101 | 00100101 |
| 26 | 010110 | 01000011 |
| 27 | 010111 | 01100111 |
| 30 | 011000 | 01001011 |
| 31 | 011001 | 01101111 |
| 32 | 011010 | 00001001 |
| 33 | 011011 | 00101101 |
| 34 | 011100 | 00000111 |
| 35 | 011101 | 00100011 |
| 36 | 011110 | 01000101 |
| 37 | 011111 | 01100001 |
| 40 | 100000 | 01100100 |
| 41 | 100001 | 01000000 |
| 42 | 100010 | 00100110 |
| 43 | 100011 | 00000010 |
| 44 | 100100 | 00101000 |
| 45 | 100101 | 00001100 |
| 46 | 100110 | 01101010 |
| 47 | 100111 | 01001110 |
| 50 | 101000 | 01100010 |
| 51 | 101001 | 01000110 |
| 52 | 101010 | 00100000 |
| 53 | 101011 | 00000100 |
| 54 | 101100 | 00101110 |
| 55 | 101101 | 00001010 |
| 56 | 101110 | 01101100 |
| 57 | 101111 | 01001000 |
| 60 | 110000 | 00101001 |
| 61 | 110001 | 00001101 |
| 62 | 110010 | 01101011 |
| 63 | 110011 | 01001111 |
| 64 | 110100 | 01100101 |
| 65 | 110101 | 01000001 |
| 66 | 110110 | 00100111 |
| 67 | 110111 | 00000011 |
| 70 | 111000 | 00101111 |
| 71 | 111001 | 00001011 |
| 72 | 111010 | 01101101 |
| 73 | 111011 | 01001001 |
| 74 | 111100 | 01100011 |
| 75 | 111101 | 01000101 |
| 76 | 111110 | 00100001 |
| 77 | 111111 | 00000101 |

Once the table representing the final state of the encoder, S, has been determined, then there are a number of ways in which to implement the closure functionality to force an encoder to a predetermined state at the end of a data frame that is to be encoded. For example, a 2-bit information sequence is sent to the encoder, shown in (octal) as 3 0 1 0 2 3 1 0 2 1 2 2. Four 0 valued symbols are padded to this sequence. Using both the top and bottom interleavers of the FIG. 13, then the two interleaved sequences 3 0 1 0 2 0 1 0 2 1 2 0 0 2 0 3 and 2 0 0 0 0 3 1 0 2 1 2 2 1 0 3 0, respectively, are generated in the top and bottom paths. By sending these sequences to the two constituent encoders (top constituent encoder and bottom constituent encoder), then the final concatenated state value of 31 may be achieved.

By employing the information acquired within the table shown above, it can be found that the coefficients of the linear representation of the state by $T_m(0), T_1(0), \ldots, T_m(3), T_l(3)$ may be determined as being 01101111. Therefore, the sequence that is sent to the turbo encoder should be 3 0 1 0 2 3 1 0 2 1 2 2 1 2 3 3; this sequence will cause both constituent encoders (the top constituent encoder and the bottom constituent encoder) to close at the end of the data frame. That is to say, this sequence will force the turbo encoder to a predetermined state at the end of the sequence. This functionality will ensure that the encoder arrives at a known state (a predetermined state) at the end of a sequence that is to be encoded. This sequence may be a data frame in some embodiments.

Figure 14:
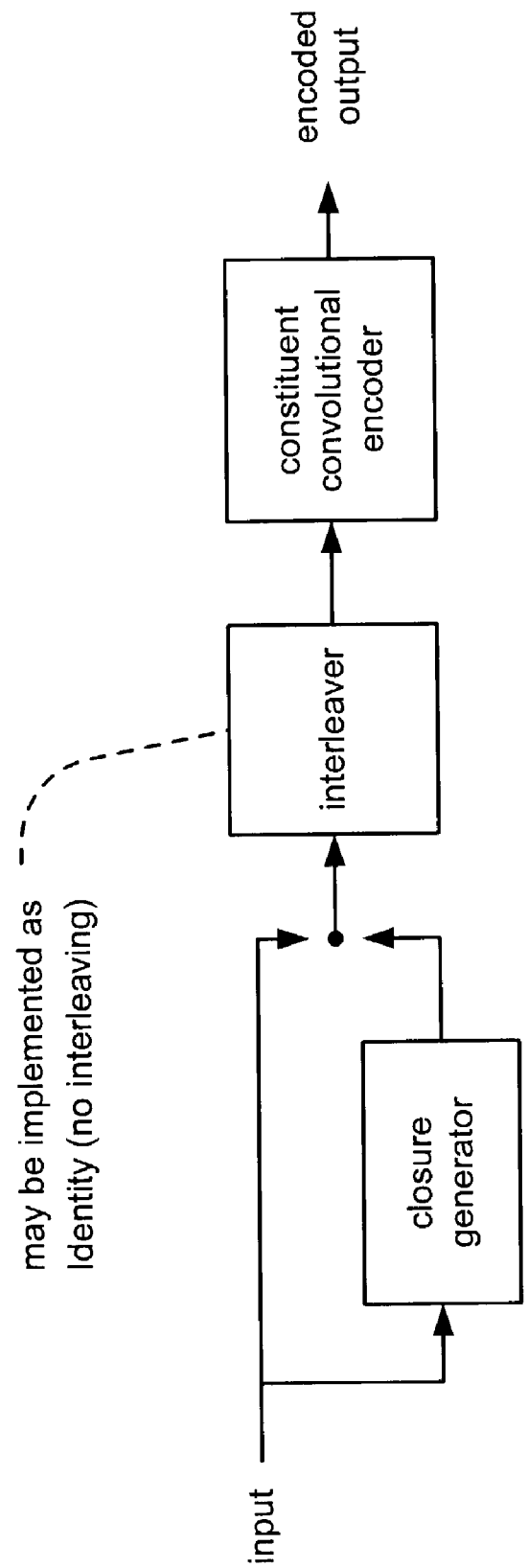
FIG. 14 is a diagram illustrating an embodiment of a closure operable convolutional encoder that is built according to the invention.

FIG. 14 is a diagram illustrating an embodiment of a closure operable convolutional encoder that is built according to the invention. The FIG. 14 shows the generic functionality of how a closure operable encoder operates. Input is provided to a closure generator and also to an interleaver that precedes a constituent convolutional encoder in this embodiment. The closure generator takes the input and determines which closure symbols should be padded, or appended, to a tail of an input sequence to force the constituent convolutional encoder to a predetermined state.

This new input sequence, that also includes the closure symbols padded to the end of the input sequence, is then provided to an interleaver. The interleaver will interleave all of the new input sequence (including the closure symbols). These closure symbols were appropriately chosen by the closure generator such that, even when they are interleaved throughout the data frame, will operate cooperatively with the other symbols of the new, now-interleaved, sequence to force the constituent convolutional encoder to a know/predetermined state when it finishes encoding the new sequence.

It is also noted that the interleaver may be implemented as being an Identity interleaver (where no interleaving is performed). That is to say, the closure operable convolutional encoder of the FIG. 14 is able to accommodate embodiments where interleaving may (or may not) be performed while still forcing the constituent convolutional encoder to the known/predetermined state.

The output of the closure operable convolutional encoder will be encoded, and the constituent convolutional encoder will also be forced to a predetermined state. This way, various sequences may be aligned properly with one another. The FIG. 14 shows very generically how a closure generator may operate in conjunction with an encoder, shown as a constituent convolutional encoder in this embodiment, to ensure that the encoder if forced to a predetermined state at the end of an input sequence.

It is also noted that the closure functionality associated with a closure operable encoder may also be implemented within encoders that encode a sequence using multiple rate controls.

Figure 15:
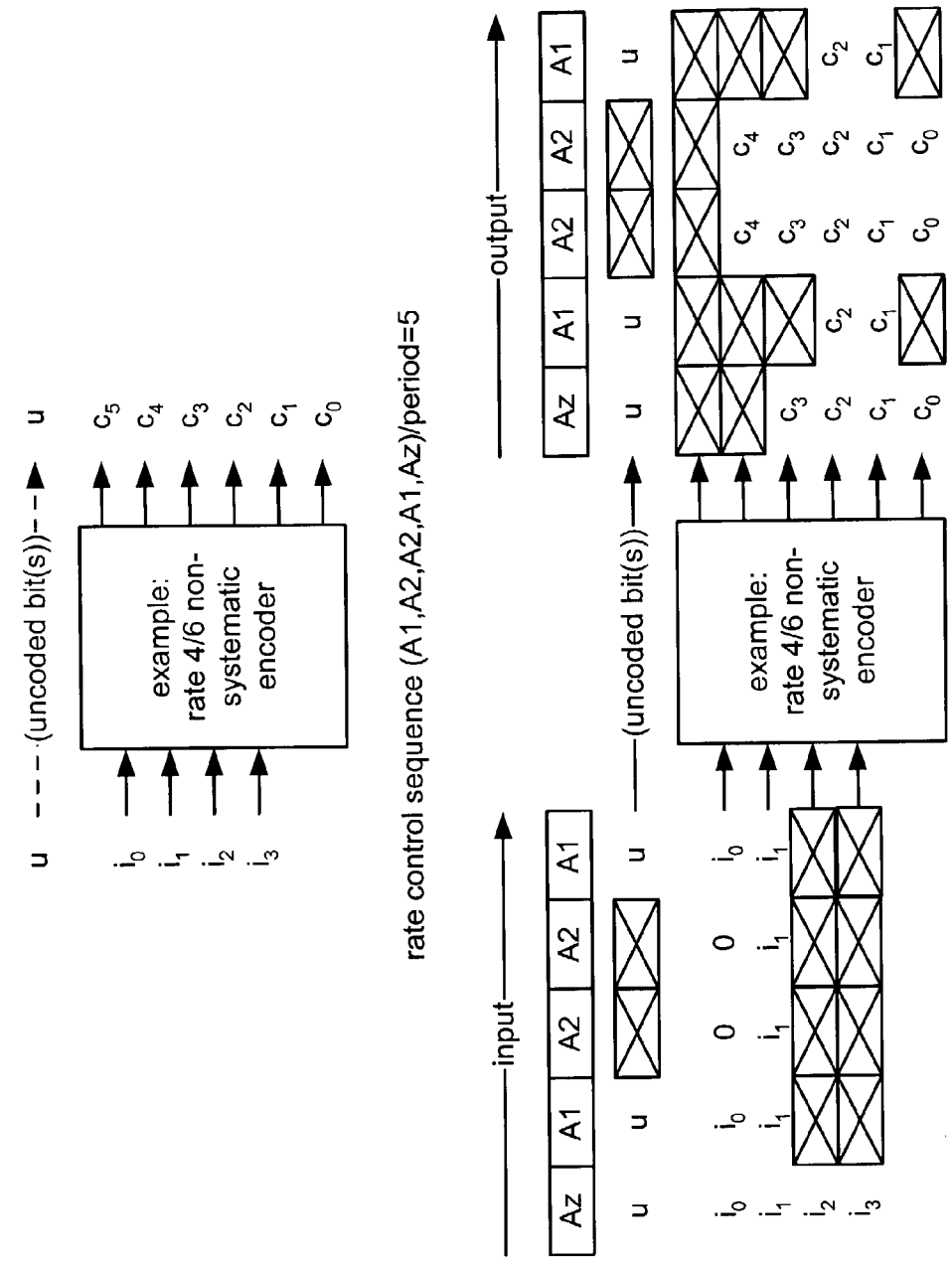
FIG. 15 is a diagram illustrating an embodiment of periodic sequencing of a non-systematic encoder using puncturing and rate control sequencing according to the invention.

FIG. 15 is a diagram illustrating an embodiment of periodic sequencing of a non-systematic encoder using puncturing and rate control sequencing according to the invention. In this example to show the periodic sequencing, a rate 4/6 non-systematic encoder is employed. The rate control sequence in this embodiment includes a rate control sequence having rate controls (RCs: RC A1, RC A2, RC A2, RC A1, and RC Az); this rate control sequence has a period of 5 RCs.

The available input of this exemplary rate 4/6 non-systematic encoder is ($i_0$, $i_1$, $i_2$, $i_3$) and the uncoded bit, and the available output is ($c_5$, $c_4$, $c_3$, $c_2$, $c_1$, $c_0$) as well as the uncoded bit. Puncturing is performed to select a predetermined sub-set of all of the available input and output bits of the rate 4/6 non-systematic encoder. The input cycles through the period of 5 RCs described above. The inputs bits cycle through the following sequence according to this particular period:

RC A1: $ui_0i_1$
RC A1: $ui_0i_1$
RC A2: $0i_1$
RC A2: $0i_1$
RC Az: $ui_0i_1i_2i_3$

The output bits of this period of RCs is as follows:

RC A1: $uc_2c_1$
RC A1: $uc_2c_1$
RC A2: $c_4c_3c_2c_1c_0$
RC A2: $c_4c_3c_2c_1c_0$
RC Az: $uc_3c_2c_1c_0$

Clearly, additional rate control sequences that include different RCs may also be employed to perform and support the functionality described herein. The generic embodiment of FIG. 15 shows how different constellations (3 bit symbols and 5 bit symbols in this example) may be used within a single rate control sequence. This means that various modulations, each having different numbers of total constellation points, may be used in a single rate control sequence.

Figure 16:
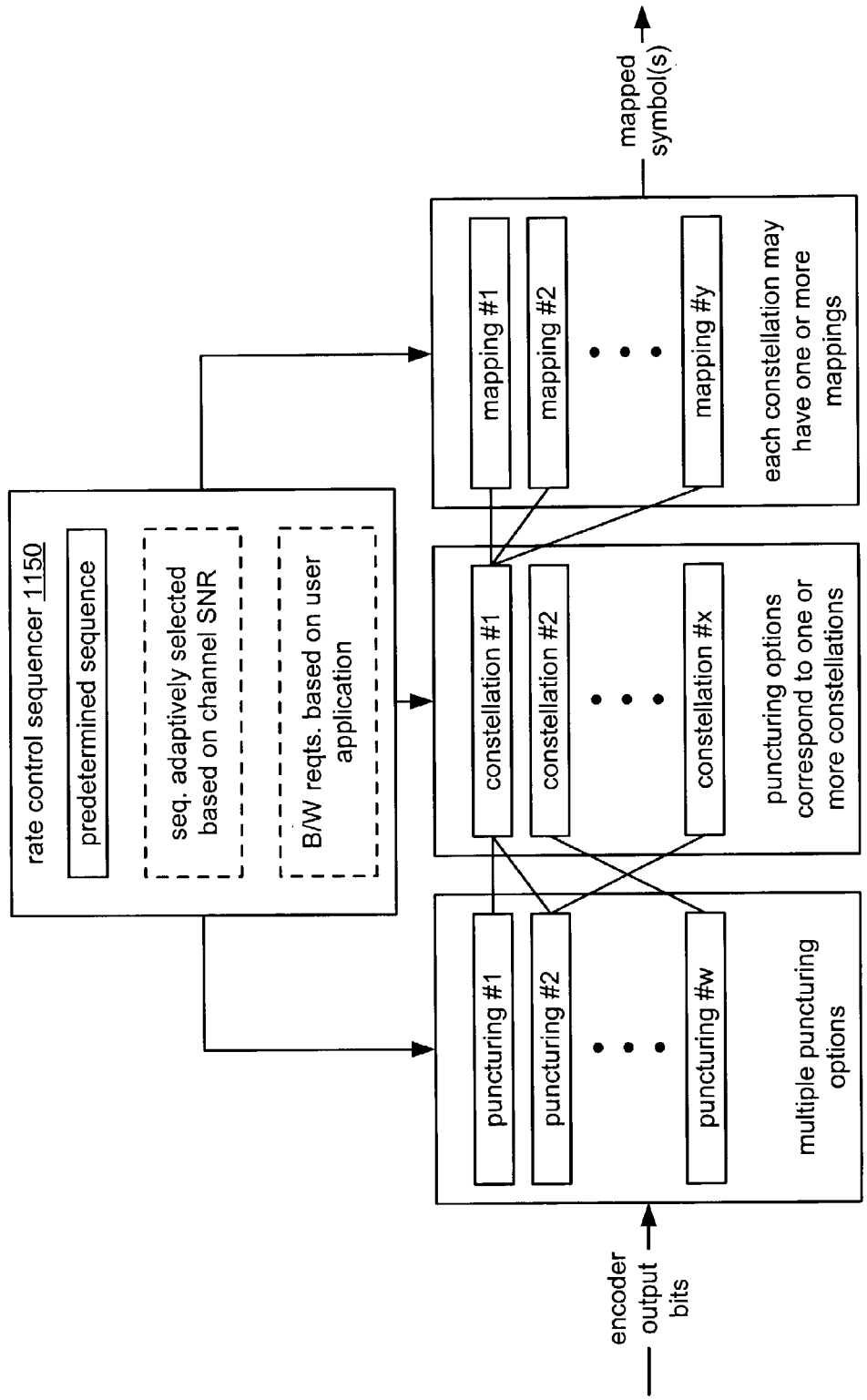
FIG. 16 is a diagram illustrating a generic embodiment of variable puncturing, constellation, and mapping using a single encoder according to the invention.

FIG. 16 is a diagram illustrating a generic embodiment of variable puncturing, constellation, and mapping using a single encoder according to the invention. The FIG. 16 particularly shows how encoder output bits may be punctured, and how the remaining bits are associated with one or more particular constellations and how each of those constellations may have a unique mapping. The control of the puncturing, the constellation, and the mapping are all governed by the rate control sequencer 1150. The rate control sequencer 1150 may cycle through a predetermined rate control sequence; it may adaptively select one or more new rate control sequence based on operating conditions such as a communication channel's SNR, bandwidth requirements based on various user applications, or according to some other consideration as well.

The available encoder output bits are provided to a functional block that may employ one or more of a number of multiple puncturing options. These puncturing options are shown generically as puncturing #1, puncturing #2, . . . , and puncturing #w. Each of these puncturing options is associated with one or more constellations (shown as constellation #1, constellation #2, . . . , and constellation #x). For example, the output bits remaining after having performed the puncturing #1 are then associated with the constellation #1. The output bits remaining after having performed the puncturing #2 may then be associated with either the constellation #1 or the constellation #x. The output bits remaining after having performed the puncturing #w are then associated with the constellation #2.

Each constellation is associated with one or more mappings, shown as mapping #1, mapping #2, . . . mapping #y. As an example, the constellation #1 is associated with more than one mapping, namely, mapping #1, mapping #2, and mapping #y. The other constellations may also be associated with various mappings as well. The encoding process includes performing encoding, puncturing, selection of a modulation (constellation and mapping). This puncturing functionality may be performed using any of the various encoder and encoding methods described herein without departing from the scope and spirit of the invention.

Figure 17:
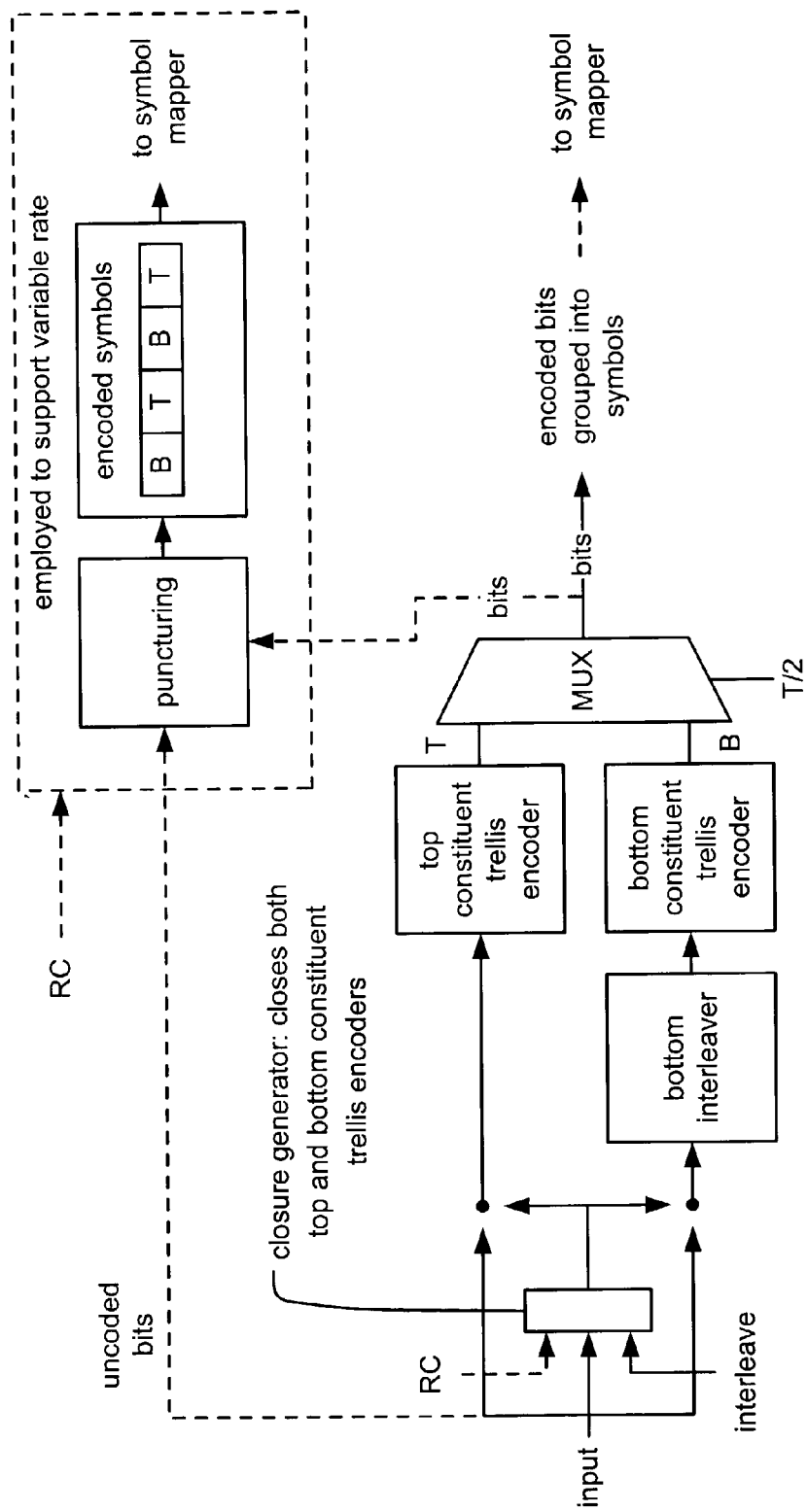
FIG. 17 is a diagram illustrating a single interleaver embodiment of a turbo encoder that is built according to the invention.

FIG. 17 is a diagram illustrating a single interleaver embodiment of a turbo encoder that is built according to the invention. The FIG. 17 shows one embodiment where a rate control sequence is also employed to govern the encoding of a sequence whose encoding is performed using closure, such that the encoder is forced to a predetermined state at the end of a sequence.

Input bits are provided simultaneously to a top path, a bottom path, and to a closure generator. The top path includes a top constituent trellis encoder, and the bottom path includes a bottom interleaver communicatively coupled to a bottom constituent trellis encoder. A variety of interleaves may be performed as selected for the particular application within the bottom interleaver. The outputs from the top and bottom paths are provided to a multiplexor (MUX) whose selection is provided by a clock signal that is clocked at ½ the rate at which the input bits are provided to the top and bottom paths. This way, the output of the MUX will alternatively select the outputs from the top and bottom paths.

The closure generator identifies the appropriate closure symbols to pad (or append) to the input bits that will ensure that both of the top constituent trellis encoder and the bottom constituent trellis encoder are forced to a predetermined state after encoding their input. These closure symbols are padded to the input before it is provided to the top constituent encoder and the bottom interleaver that precedes the bottom constituent encoder. The closure generator operates using the closure functionality described herein.

The bits that are output from the MUX may be viewed as encoded bits that are grouped into symbols. These encoded symbols are then provided to a symbol mapper that maps them according to the mapping associated with their modulation constellation and modulation.

However, in some embodiments, these output bits are then output to a puncturing functional block. Again, in certain embodiments, no puncturing is performed on the bits output from the MUX; they are all simply passed as output from the puncturing functional block (as described above). However, in other embodiments, puncturing is performed according to the rate control sequence provided by the rate control sequencer 1150. A variety of encoded symbols may then be then generated according to the outputs from the top and bottom paths; the bottom path being an interleaved path. These encoded symbols are then passed to the symbol mapper according to the invention where the symbols are mapped according to the appropriate modulation (constellation and mapping) as governed by the rate control sequence provided by the rate control sequencer 1150. The single interleaver embodiment of a turbo encoder shows just one of the many embodiments in which TTCM encoding may be performed. Other turbo encoding embodiments are also envisioned within the scope and spirit of the invention to support the variable code rate functionality described herein.

Figure 18:
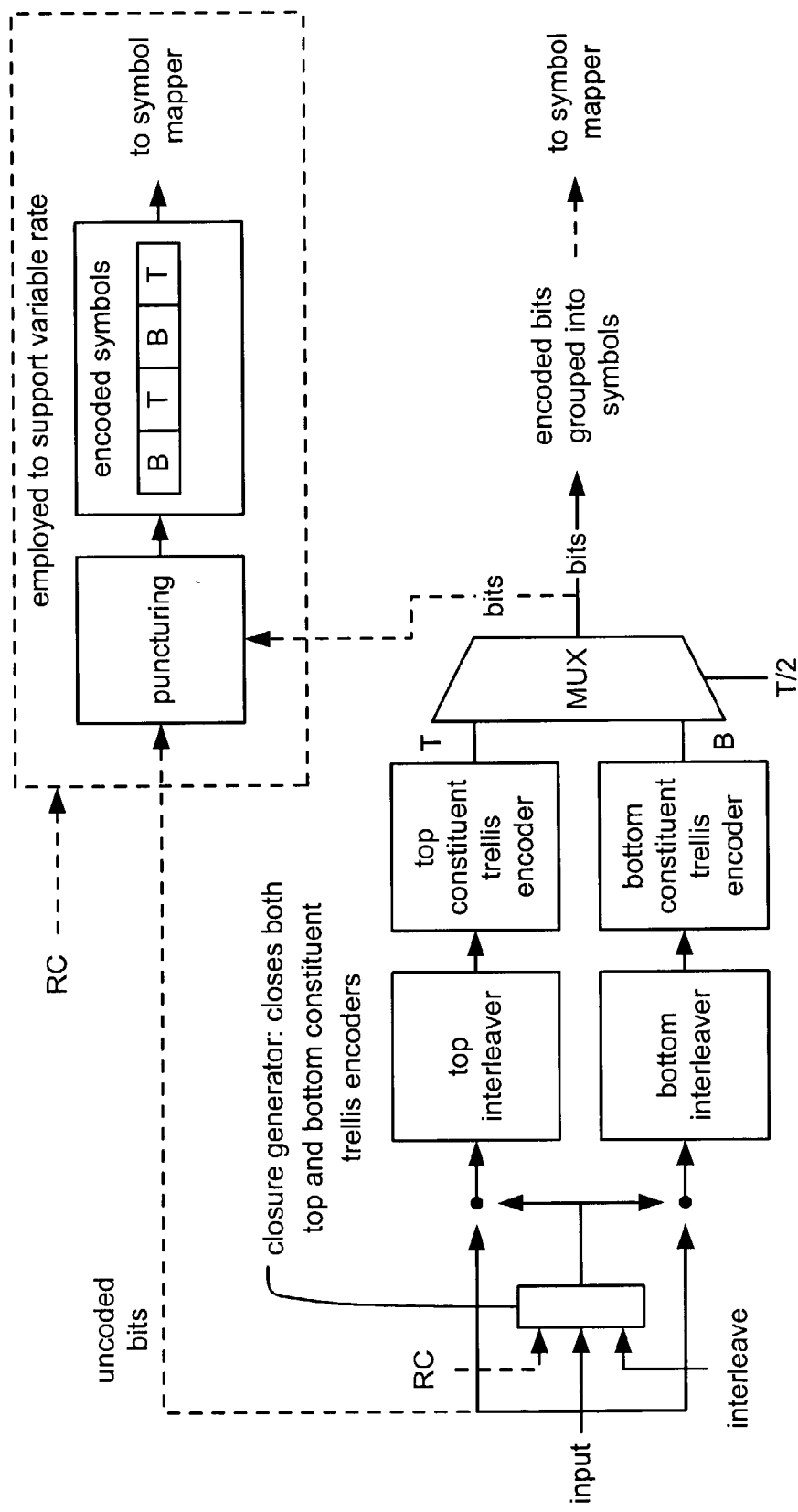
FIG. 18 is a diagram illustrating a dual interleaver embodiment of a turbo encoder that is built according to the invention.

FIG. 18 is a diagram illustrating a dual interleaver embodiment of a turbo encoder that is built according to the invention. This dual interleaver embodiment of the turbo encoder is similar to the single interleaver embodiment of the FIG. 17. Input bits are provided simultaneously to a top path, a bottom path, and a closure generator. The top path includes a top interleaver communicatively coupled to a top constituent trellis encoder, and the bottom path includes a bottom interleaver communicatively coupled to a bottom constituent trellis encoder. The outputs from the top and bottom paths are provided to a multiplexor (MUX) whose selection is provided by a clock signal that is clocked at ½ the rate at which the input bits are provided to the top and bottom paths. This way, the output of the MUX will alternatively select the outputs from the top and bottom paths.

Similar to the embodiment of the FIG. 17, the closure generator identifies the appropriate closure symbols to pad (or append) to the input bits that will ensure that both of the top constituent trellis encoder and the bottom constituent trellis encoder are forced to a predetermined state after encoding their input. These closure symbols are padded to the input before it is provided to the top interleaver that precedes the top constituent encoder and also to the bottom interleaver that precedes the bottom constituent encoder. Therefore, the closure symbols are interleaved with the other symbols of the data frame. The closure generator operates using the closure functionality described herein.

As also with the embodiment described above in the FIG. 17 for the interleaving performed by the bottom interleaver, a variety of interleaves may be performed as selected for the particular application. The following example shows one embodiment of how the interleaving may be performed for the top interleaver and the bottom interleaver within the FIG. 18.

For each of the top interleaver and the bottom interleaver, we let $\pi_0$ and $\pi_1$ be the interleaves for each bit within the two bit input symbol, $i_0 i_1$. According to the FIG. 18, the following modified interleavers (top interleaver and bottom interleaver) are employed within the encoding process; these modified interleavers are each variants of the interleaver, $\pi_I$, as defined below. There are, in effect, two interleaves that are functionally performed within the top interleaver, and two interleaves are functionally performed within the bottom interleaver. A total of four interleaves are performed by the top interleaver and bottom interleaver in this embodiment. These interleaves are performed independently for each bit within the two bit input symbol, $i_0 i_1$. The decoding process, described in more detail below, may employ the modified interleaving/de-interleaving shown here during initialization; however, when performing actual decoding of a received symbol's bits, it only employs the non-modified interleaver, $\pi_I$, and the de-interleaver, $\pi_I^{-1}$. Within this dual interleaver embodiment of the turbo encoder, the modified interleaving is performed as follows:

Top interleaver=i for i mod 2=0 (for even positions)
Top interleaver=$\pi_I^{-1}$(i) for i mod 2=1 (for odd positions)
Bottom interleaver=$\pi_I$(i) for i mod 2=0
Bottom interleaver=i for i mod 2=1
Where, l=0,1 for two bit input symbol, $i_0 i_1$.

This modified interleaving is performed to ensure the following: when a symbol sequence, $S_1 S_2 S_3 S_4$, is input, then encoded corresponding output from those symbols will be to be in the same order, namely, the encoded output for $S_1$, followed by the encoded output for $S_2$, followed by the encoded output for $S_3$, and finally followed by the encoded output for $S_4$. The output encoded symbol sequence, shown as BTBT, will maintain this sequential order (based on the order of the input symbols) because of the modified interleaving performed herein. Clearly, other embodiments may be implemented where the order of the input and the order of the output encoded symbol sequence are not in the same order. However, within this embodiment, the input symbols (or input bits) come into the encoder according to a particular sequence, and the encoded symbols that are output from the TTCM encoder leave according to that same sequence.

Again, this interleaving shows just one example of how interleaving may be performed according to the invention. Other interleaves may also be designed for a particular application. This particular interleaving is used to illustrate the functionality of the invention in several embodiments of the invention in the various Figures and written description.

Moreover, in some embodiments, these output bits are then output to a puncturing functional block. In certain embodiments, no puncturing is performed on the bits output from the MUX; they are all simply passed as output from the puncturing functional block. However, in other embodiments, puncturing is performed according to the rate control sequence provided by the rate control sequencer 1150. A variety of encoded symbols may then be then generated according to the outputs from the top and bottom paths; the bottom path being an interleaved path. These encoded symbols are then passed to the symbol mapper according to the invention where the symbols are mapped according to the appropriate modulation (constellation and mapping) as governed by the rate control sequence provided by the rate control sequencer 1150. The single interleaver embodiment of a turbo encoder shows just one of the many embodiments in which TTCM encoding may be performed. Other turbo encoding embodiments are also envisioned within the scope and spirit of the invention to support the variable code rate functionality described herein.

The functionality supported by the closure generator that ensures closure of the top interleaver and the bottom interleaver of the FIG. 18 may be described mathematically as follows:

The beginning definitions are employed:

A TTCM of block size N with rate control sequence, rc(0), rc(1), . . . , rc(N−1);

L numbers among this sequence that are not equal to 7 or 8;

a subsequence by, rc($n_0$), rc($n_1$), . . . , rc($n_{L-1}$);

the following x bit vectors:

$$S_{T,l}(i)=I_l[(N-\pi_{T,l}(n_{L-1-i})\mod(2^x-1))];$$

$$S_{T,m}(i)=I_m[(N-\pi_{T,m}(n_{L-1-i})\mod(2^x-1))];$$

$$S_{B,l}(i)=I_l[(N-\pi_{B,l}(n_{L-1-i})\mod(2^x-1))];$$

$$S_{B,m}(i)=I_m[(N-\pi_{B,m}(n_{L-1-i})\mod(2^x-1))];$$

for all i=1, . . . , $2^x$−1. By employing these vectors, the following sequence of 2x bit vectors may be defined as follows:

$$T_l(i)=[S_{B,l}(i)\ S_{T,l}(i)]$$

$$T_m(i) = \begin{cases} 0 & rc(N-1-i) = 5, 7, 8, 9, A, D \\ [S_{B,m}(i)\ S_{T,m}(i)] & \text{otherwise} \end{cases}$$

for all possible integer i.

If any binary 2x bit vector can be linearly represented by the 2M vectors, $T_m(1)$, $T_l(1)$, $T_m(2)$, $T_l(2)$, $T_m(M)$, $T_l(M)$, then the two constituent encoders in a turbo encoder can be closed (forced to a predetermined state) by adding M extra 2 bit symbols to the information sequence.

Figure 19:
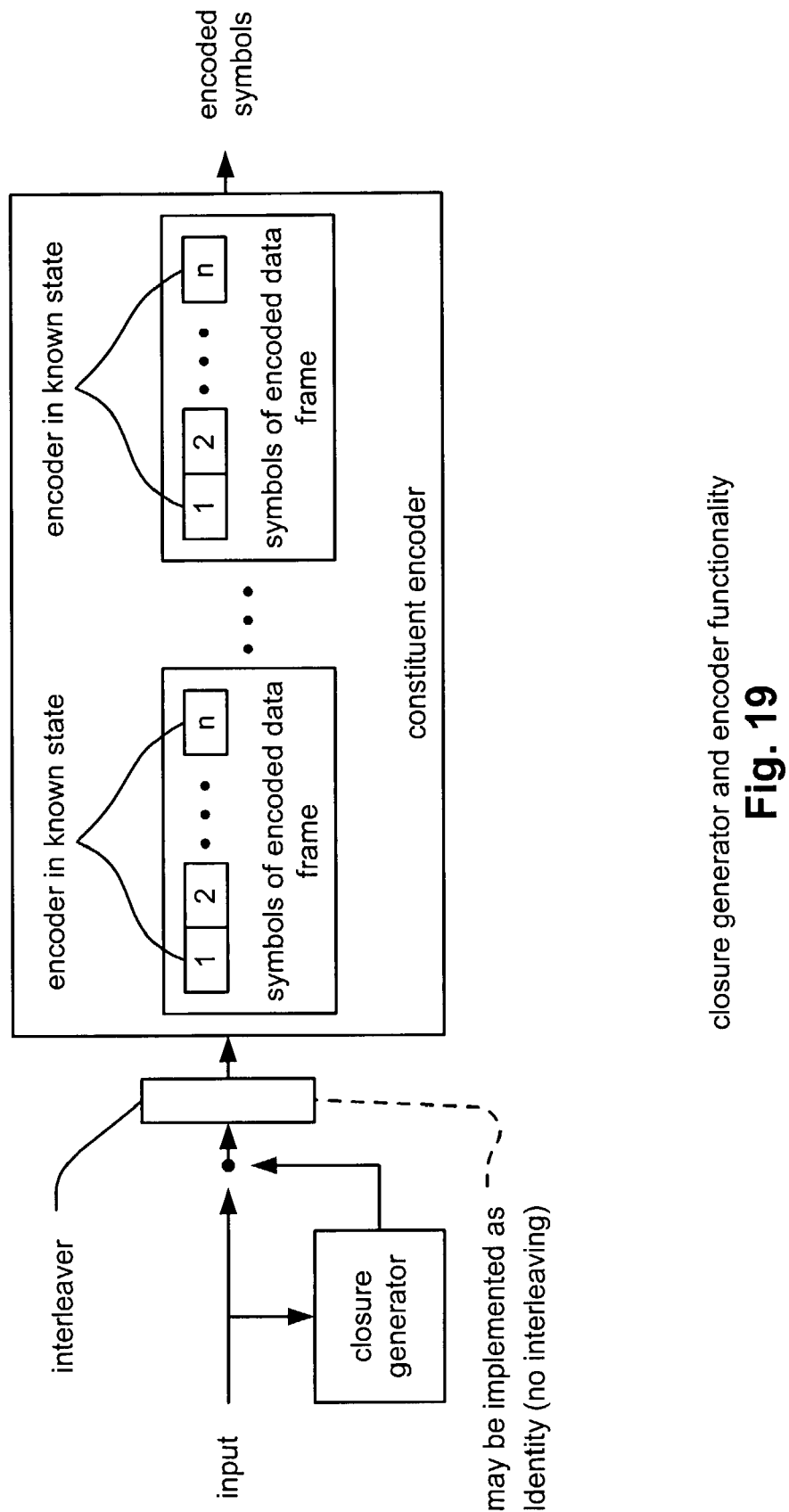
FIG. 19 is a functional block diagram illustrating an embodiment of closure generator and encoder functionality that is arranged according to the invention.

FIG. 19 is a functional block diagram illustrating an embodiment of closure generator and encoder functionality that is arranged according to the invention. The FIG. 19 shows how input is provided to a constituent encoder and to an interleaver that precedes a closure generator. As also within other embodiments described above, the interleaver may be implemented such that no interleaving is performed at all, but rather an Identity interleaving process is performed. The constituent encoder encodes a number of data frames, each having a number of symbols, 1, 2, . . . , n. The encoder is at a known/predetermined state at the beginning of each data frame and at the end of each data frame. The FIG. 19 graphically shows how an encoder that operates using the closure functionality described herein will begin and end each frame at a predetermined state.

It is noted that closure symbols, that are padded to an end of the input as directed by the closure generator, will also be interleaved within embodiments where the interleaver is not implemented as an Identity interleaving process.

Figure 20:
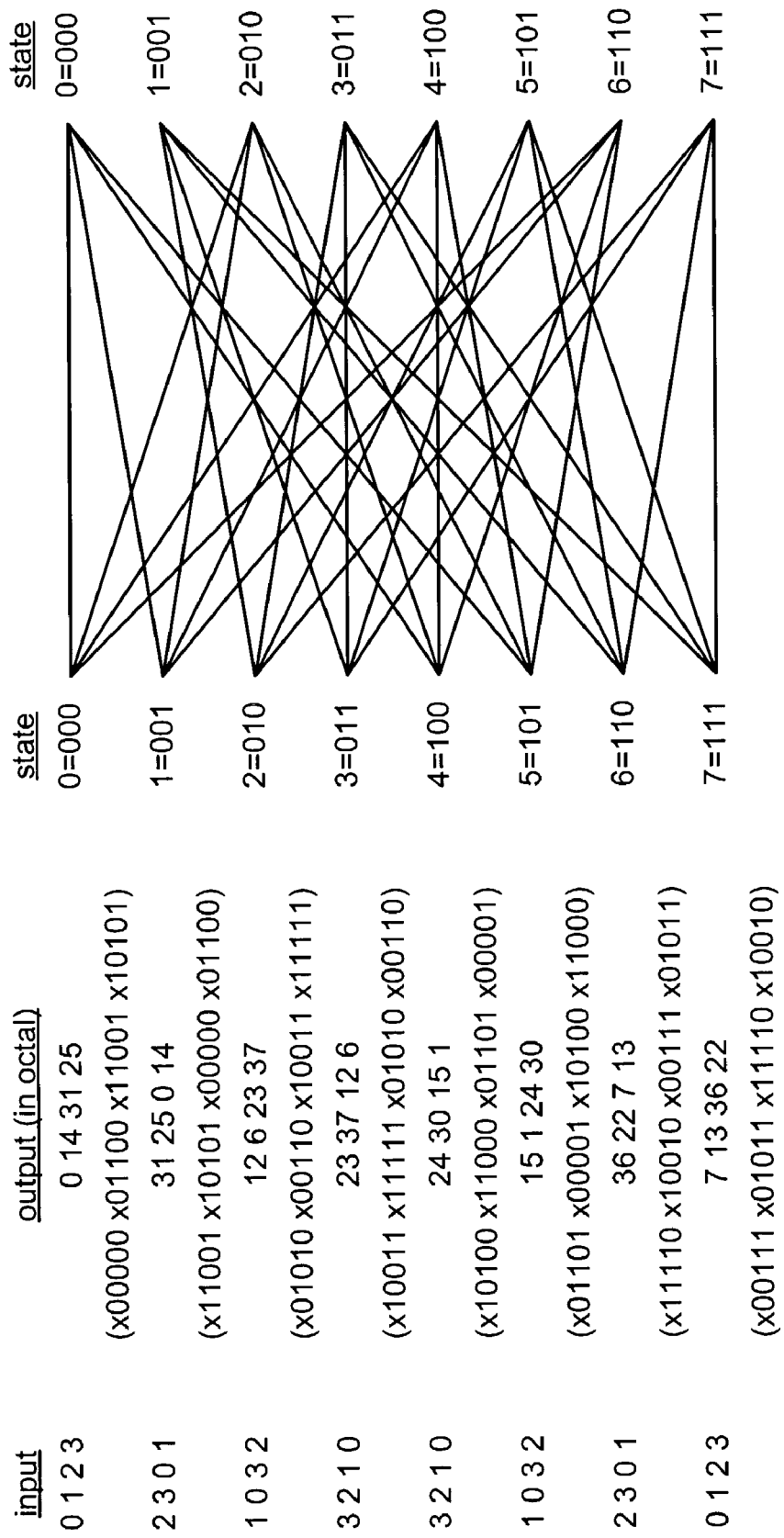
FIG. 20 is a trellis diagram illustrating an embodiment of a trellis employed by an 8 state (3 register), 2 bit input symbol, rate ⅖ encoder.

FIG. 20 is a trellis diagram illustrating an embodiment of a trellis employed by an 8 state (3 register), 2 bit input symbol, rate ⅖ encoder. It is noted that the trellis shown within the FIG. 20 is selected offline and employed for all of the encoding/decoding in this particular embodiment. The trellis is an 8 state (3 register) trellis whose input/output trellis transfer function is shown within the FIG. 20. Each of the inputs is shown in symbol form of the 4 possible inputs: 0 is for $i_0i_1$=00, 1 is for $i_0i_1$=01, 2 is for $i_0i_1$=10, and 3 is for $i_0i_1$=11. The outputs are shown in octal; however, only the first 5 bits are employed in this embodiment.

This trellis is employed by a rate ⅖ non-systematic prototype encoder, so only five coded output bits are available. It is noted that all of the metrics according to the trellis may be represented by 16 unique metrics. Although there are 5 available bits as the output of such a rate ⅖ non-systematic prototype encoder, when considering the number of options as being $2^5$=32, it is seen that this particular trellis design may be represented with 16 distinct metrics. Moreover, an efficient hardware implementation allows these 16 distinct metrics to be represented with 8 distinct metric values.

The $6^{th}$ bit is simply not employed in the rate ⅖ encoder described here; the outputs may be viewed, in octal form, as being $xc_4c_3c_2c_1c_0$, where x represents an unused bit. It is noted, however, that some other embodiments (say, in a rate ⅖ encoder) may employ all 6 output bits when performing a rate ⅖ encoder.

For example, following the operation and function of the trellis, starting from the state of 0=000, the following transitions may be achieved:

When the encoder is in the state 0=000, and when the input $i_0i_1$=00=0, then the state of the encoder will transition to state 0=000, and the output will be $xc_4c_3c_2c_1c_0$=x00000=0. When the encoder is in the state 0=000, and when the input $i_0i_1$=01=1, then the state of the encoder will transition to state 2=010, and the output will be $xc_4c_3c_2c_1c_0$=x01100=14. When the encoder is in the state 0=000, and when the input $i_0i_1$=10=2, then the state of the encoder will transition to state 4=100, and the output will be $xc_4c_3c_2c_1c_0$=x11001=31. When the encoder is in the state 0=000, and when the input $i_0i_1$=11=3, then the state of the encoder will transition to state 6=110, and the output will be $xc_4c_3c_2c_1c_0$=x10101=25.

The transitions from other initial states may similarly be followed according to the trellis. It is here noted that this trellis represents one such trellis that may be employed to perform TTCM encoding. Other trellises may similarly be employed without departing from the scope and spirit of the invention. The encoding employs this trellis when performing each of the various rate control sequences provided by the rate control sequencer 1150 to the rate ⅖ non-systematic prototype encoder.

Figure 21:
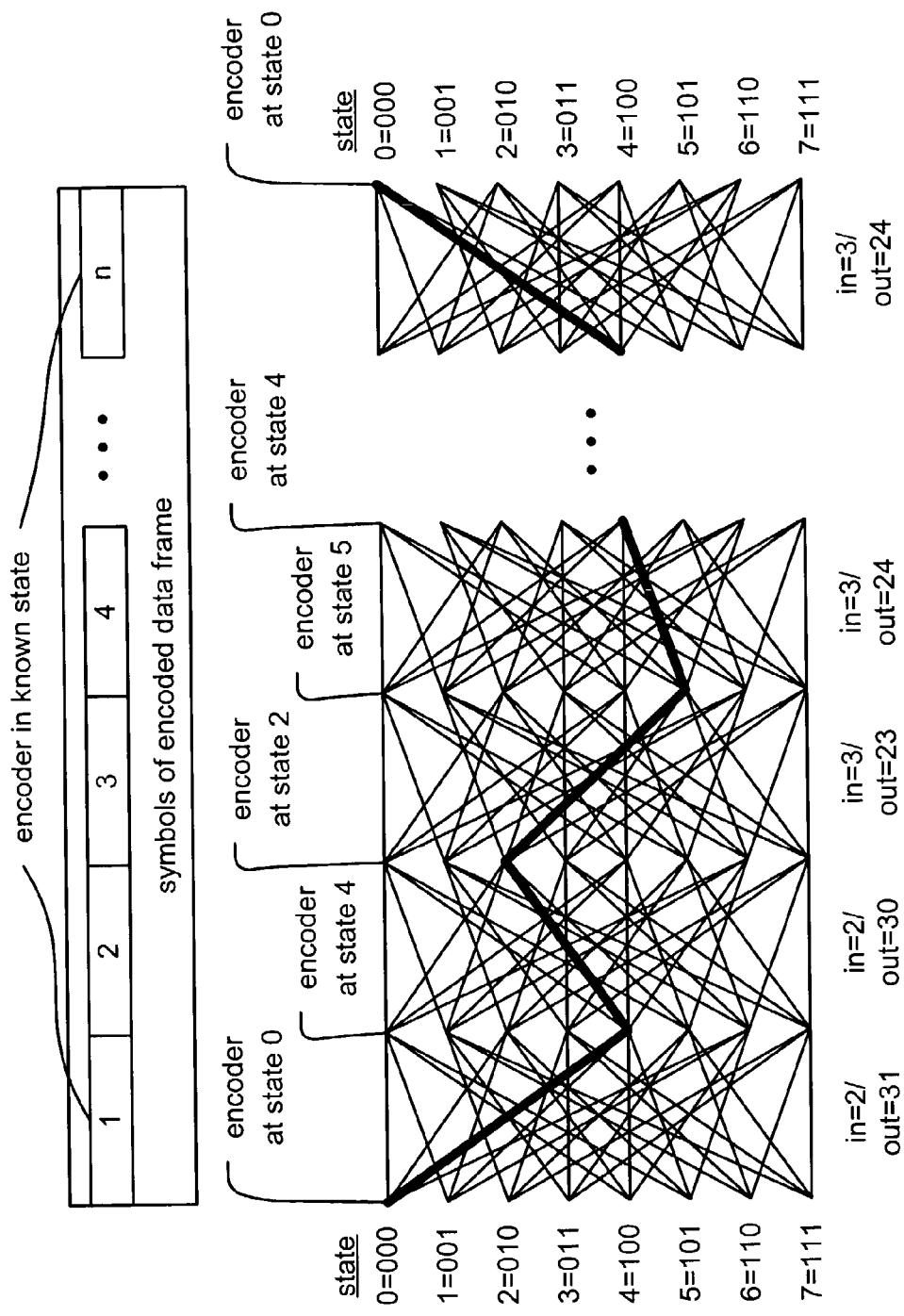
FIG. 21 is a diagram illustrating an example of closure governed trellis transitions of the trellis of the FIG. 20.

FIG. 21 is a diagram illustrating an example of closure governed trellis transitions of the trellis of the FIG. 20. The closure governed state transitions, according to the trellis, may be traced for multiple symbols of an encoded data frame. For example, according to this particular trellis, the encoder is initially at state 0 at the beginning of the data frame.

An input symbol having the value of 2 (binary 10) is input into the encoder, and a symbol is output having the value of 31 (octal x11001); when the encoder encodes this symbol, the encoder transitions states from the state having the value 0 to the state having the value 4.

When encoding the second symbol of the data frame, an input symbol having the value of 2 (binary 10) is input into the encoder, and a symbol is output having the value of 30 (octal x11000); when the encoder encodes this symbol, the encoder transitions states from the state having the value 4 to the state having the value 2.

When encoding the third symbol of the data frame, an input symbol having the value of 3 (binary 11) is input into the encoder, and a symbol is output having the value of 23 (octal x10011); when the encoder encodes this symbol, the encoder transitions states from the state having the value 2 to the state having the value 5.

When encoding the fourth symbol of the data frame, an input symbol having the value of 3 (binary 11) is input into the encoder, and a symbol is output having the value of 24 (octal x10100); when the encoder encodes this symbol, the encoder transitions states from the state having the value 5 to the state having the value 4.

The encoding process continues on throughout the frame. At the end of the frame, closure symbols, provided to the encoder, ensure that the encoder is forced back to the state having the value 0 at the end of the data frame. For example, when encoding the last symbol of the data frame, an input symbol having the value of 3 (binary 11) is input into the encoder, and a symbol is output having the value of 24 (octal x10100); when the encoder encodes this symbol, the encoder transitions states from the state having the value 4 to the state having the value 0.

Figure 22:
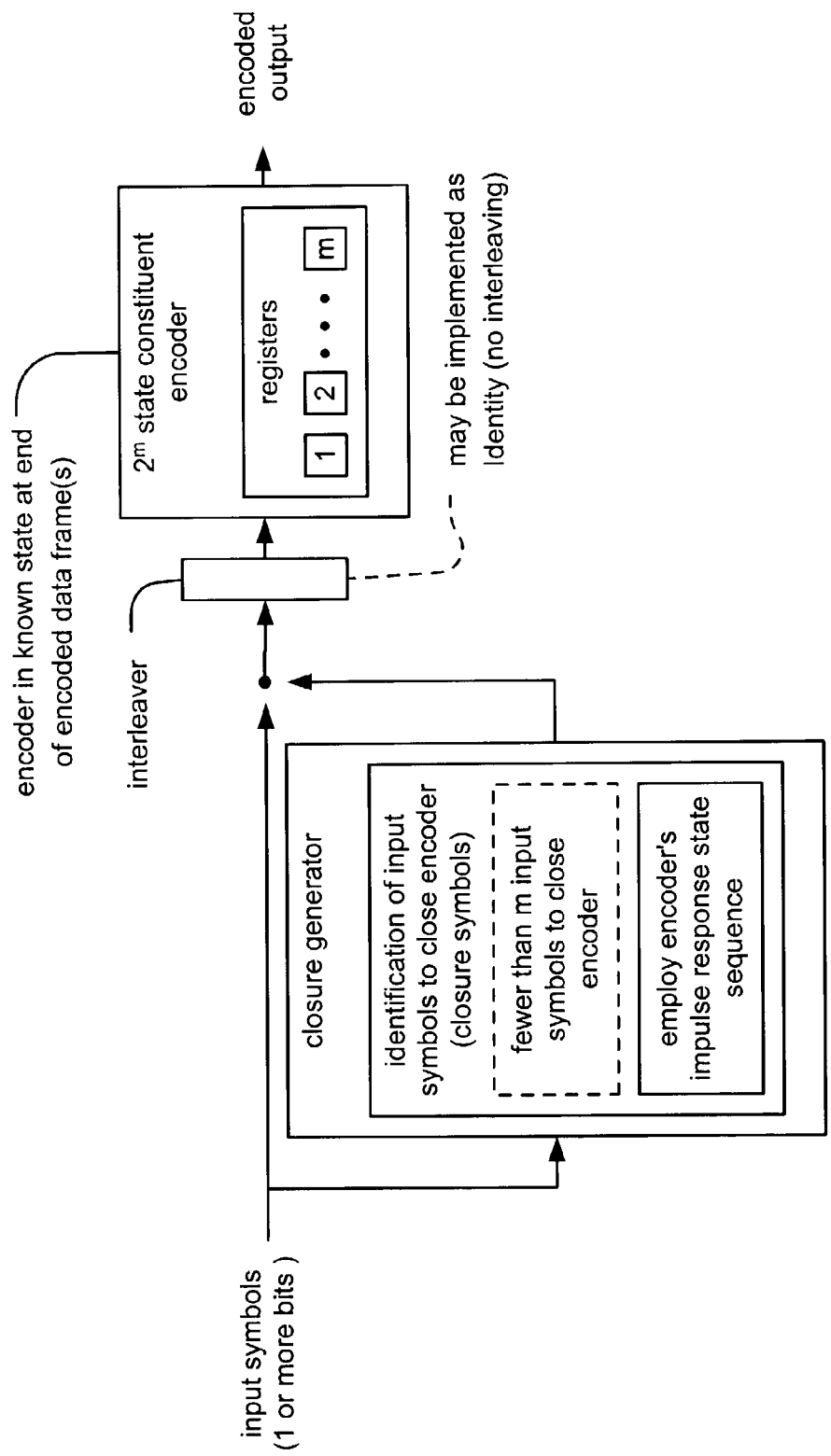
FIG. 22 is a functional block diagram illustrating an embodiment of closure functionality of a $2^m$ state constituent encoder that is arranged according to the invention.

FIG. 22 is a functional block diagram illustrating an embodiment of closure functionality of a $2^m$ state constituent encoder that is arranged according to the invention. Input symbols, composed of one or more bits, are provided to a $2^m$ state constituent encoder and to an interleaver that precedes a closure generator. Again, as also within other embodiments described above, the interleaver may be implemented such that no interleaving is performed at all, but rather an Identity interleaving process is performed.

The $2^m$ state constituent encoder includes m registers. The closure generator performs identification of input symbols that are employed to close the encoder at the end of a sequence (the end of a data frame in some embodiments). These symbols, called closure symbols herein, are padded to the input, and after the input is interleaved and encoded, then the encoder will be forced to a predetermined state. In some of the embodiments shown, the predetermined state is the state having a value of 0. However, the predetermined state may be any other state of a multi-state encoder as defined in a given application.

The closure generator employs the encoder's impulse response state sequence to determine which closure symbols are required to force the encoder to a predetermined state. In some embodiments, as described above, a fewer number of closure symbols are required to force the encoder to a predetermined state that the encoder has registers. For example, in some embodiments, fewer than m input symbols are required to close the $2^m$ state constituent encoder.

The closure of a $2^m$ state and k-bit convolutional encoder may be described as follows:

For any $l \in \{0, \ldots, k-1\}$, the l-th impulse response m-bit state sequence may be defined as $I_l(i-1)$ for $i-1, 2, \ldots$, where the l-th impulse sequence is a k-bit symbol sequence with the first symbol (0...010...0)(1 is in the l-th position) and the rest are 0s. These state sequences have a period of $2^m-1$.

For example, for a k-bit symbol sequence, $(u_{k-1,0}, \ldots, u_{0,0}), \ldots, (u_{k-1,N-1}, \ldots, u_{0,N-1})$ that is sent to the $2^m$ state and k-bit convolutional encoder with the impulse response states, $I_l(i)$, $l=0, \ldots, k-1$, then the final state of the encoder may be shown as follows:

$$S = \sum_{i=0}^{N-1}\left(\sum_{l=0}^{k-1} u_{l,i} I_l((N-i-1)\bmod(2^m-1))\right)$$

If any binary m-bit vector can be linearly represented by the kM vectors, $I_0(0), \ldots, I_{k-1}(0), \ldots, I_0(M-1), I_{k-1}(M-1)$, then this convolutional encoder can be closed by padding M extra k-bit symbol to the information sequence.

This process may also be extended to close two constituent encoders of a turbo encoder, as in the embodiments shown within the FIGS. 13, 17, and 18 as examples. A k-bit interleave, $\pi=(\pi_{k-1}, \ldots, \pi_0)$ is employed to interleave the sequence, $(u_{k-1,0}, \ldots, u_{0,0}), \ldots, (u_{k-1,N-1}, \ldots, u_{0,N-1})$, to generate the interleaved sequence, $(v_{k-1,0}, \ldots, v_{0,0}), \ldots, (v_{k-1,N-1}, \ldots, v_{0,N-1})$. For example, this may also be shown mathematically as $v_{l,\pi_l(i)}=u_{l,i}$, for $l=0, \ldots, k-1$ and for $i=0, \ldots, N-1$. By sending the interleaved sequence to a $2^m$ state and k-bit convolutional encoder, then the final state of the encoder may be shown as follows:

$$S = \sum_{i=0}^{N-1}\left(\sum_{l=0}^{k-1} u_{l,i} I_l((N-i-1)\bmod(2^m-1))\right)$$

In addition, when a turbo encoder employs two interleavers whose interleaves are the same. The top and bottom interleaves, of size L, are defined as follows:

$\pi_T=(\pi_{T,k-1}, \ldots, \pi_{T,0})$ is the interleaving for the top interleaver.

$\pi_B=(\pi_{B,k-1}, \ldots, \pi_{B,0})$ is the interleaving for the bottom interleaver.

The following states may then also be defined:

$S_{T,l}(i)=I_l\lfloor(L-\pi_{T,l}(L-1-i)\bmod(2^m-1))\rfloor$, for $l=0, \ldots, k-1$ $S_{B,l}(i)=I_l\lfloor(L-\pi_{B,l}(L-1-i)\bmod(2^m-1))\rfloor$, for $l=0, \ldots, k-1$ By concatenating this top vector, $S_{T,l}(i)$, and this bottom vector, $S_{B,l}(i)$, then a number of $2^m$-bit vectors may be defined as follows: $T_l(i)=(S_{B,l}(i), S_{T,l}(i))$.

For example, if any binary 2m-bit vector can be linearly represented by the kM vectors, $T_{k-1}(0), \ldots, T_0(0), T_{k-1}(1), \ldots, T_0(1), \ldots, T_{k-1}(M-1), \ldots, T_0(M-1)$, then the two constituent encoders in the turbo encoder can be closed by adding M extra k-bit symbols to the information sequence.

Figure 23:
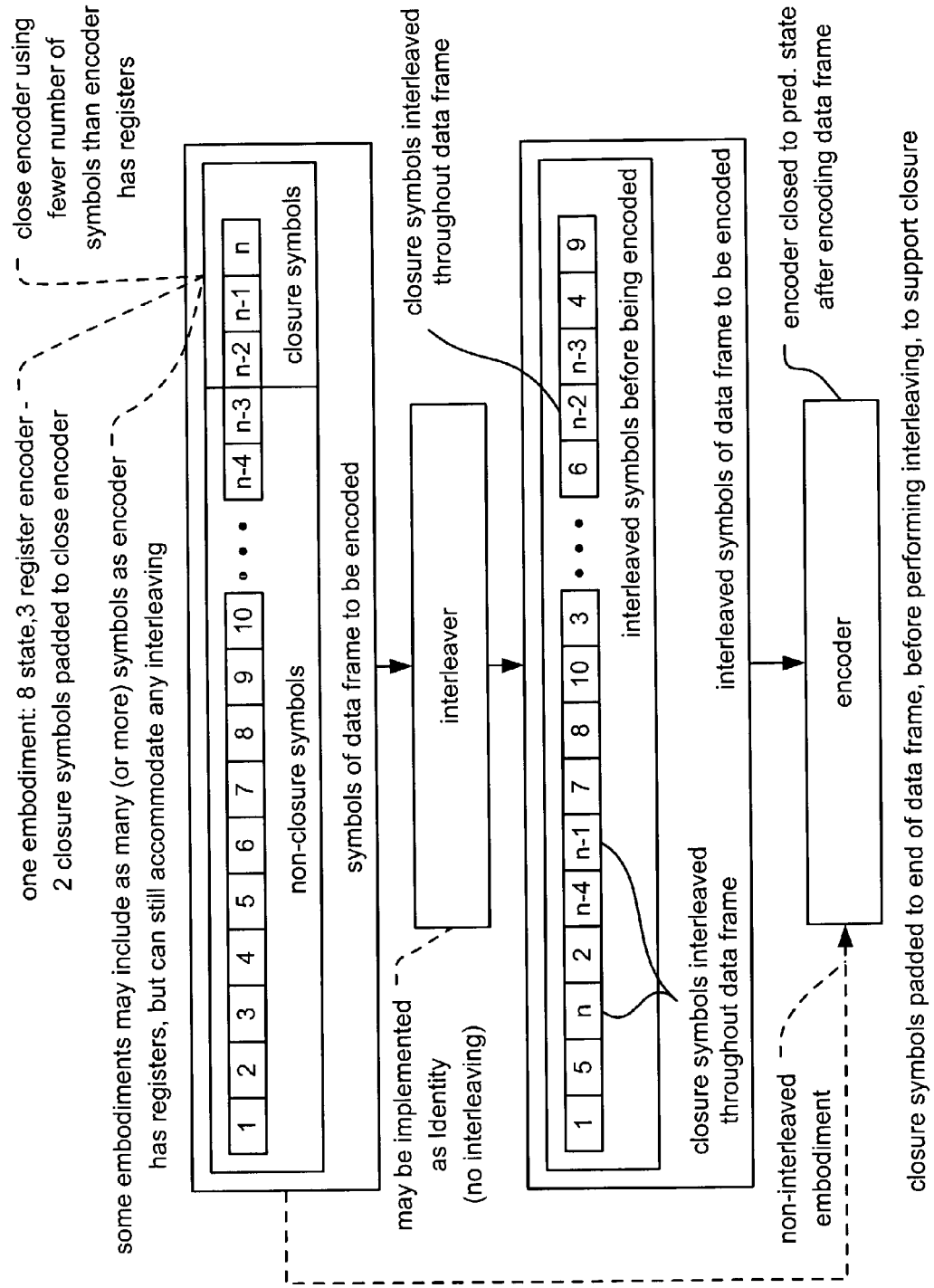
FIG. 23 is a diagram illustrating an embodiment of closure symbols padded to end of data frame, before performing interleaving, to support closure.

FIG. 23 is a diagram illustrating an embodiment of closure symbols padded to end of data frame, before performing interleaving, to support closure. The FIG. 23 shows an embodiment where closure symbols are padded (or appended) to an end of a data frame that is to be encoded. The total data frame then includes both the non-closure symbols (e.g., information symbols) as well as the closure symbols. These closure symbols are padded to the end of the data frame before performing any interleaving. Within embodiments that do perform some interleaving, then the selection of the closure symbols considers the actual interleaving that is to be performed. After any interleaving has been performed, then the interleaved symbols of the data frame that is to be encoded is shown such that the closure symbols are interleaved throughout the data frame.

Within embodiments that the interleaver simply is implemented as an Identity interleaving process, then the data frame, with the padded closure symbols, is simply passed to the encoder. However, even within embodiments that do perform some interleaving on the data frame (that also includes the closure symbols), then that interleaved data frame is also passed to the encoder. Again, it is noted that the selection of the closure symbols is made while considering the effects of any interleaving (if any is performed within the given embodiment). Therefore, in either case (interleaving or no interleaving), the encoder will be forced to the know/predetermined state when it finishes encoding the entire data frame.

The closure of the encoder, in forcing the encoder to a predetermined state at the end of the data frame using the closure symbols, may be performed using fewer symbols than the encoder has registers. For example, in one embodiment that employs an 8 state/3 register encoder, the closure symbols padded to the end of the data frame constitute only 2 symbols. It is also noted that, depending on the encoder design, the trellis that is employed, and the interleaving, the same number of closure symbols (as the encoder has registers) may be required; in some instances, even more closure symbols may be required. However, the invention is able to accommodate the effects of any interleaving that may be performed whereas prior art approaches have no solution to deal with the effects of interleaving.

Figure 24:
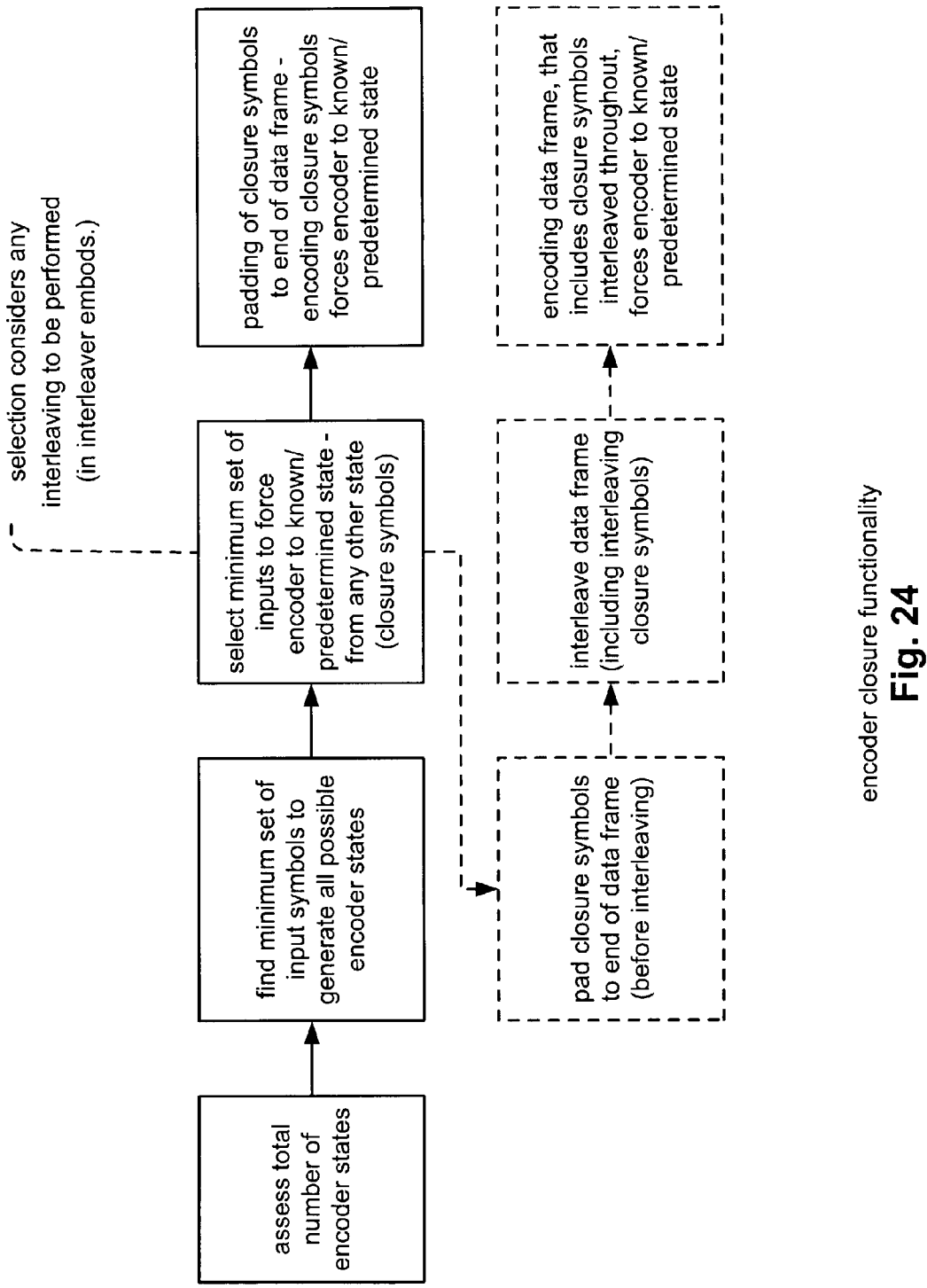
FIG. 24 is a functional block diagram illustrating an embodiment of encoder closure functionality that is arranged according to the invention.

FIG. 24 is a functional block diagram illustrating an embodiment of encoder closure functionality that is arranged according to the invention. Within the FIG. 24, the total number of encoder states of a multi-state encoder are initially assessed. After this is performed, a minimum set of input symbols is found that can generate all the possible encoder states beginning from any of the other states of the multi-state encoder. For example, this may include identifying a minimum linear independent set of input symbols that may be used to perform the minimum number of transitions to force the encoder to a predetermined state from any of the other states of the encoder.

Afterwards, based on the particular state of the encoder, a minimum set of inputs in selected, from the minimum set of input symbols, to force the encoder to the predetermined state. This selection will be performed by considering any interleaving that may be performed within a given embodiment. These selected symbols may be referred to as closure symbols. The closure symbols serve the function of forcing the encoder back to a predetermined state at the end of an input sequence that is to be encoded. This sequence may be a data frame in some embodiments. These closure symbols are then padded/appended to an end of a data frame to force the encoder to the predetermined state. This data frame may undergo interleaving; in such instances, the closure symbols are padded/appended to the end of the data frame before the entire data frame (including the closure symbols) are interleaved. Even after the data frame undergoes interleaving, the encoder will still be forced to a known/predetermined state after encoding that data frame.

Within those embodiments that do perform interleaving, the closure symbols are padded to the end of the data frame before the data frame is interleaved. The closure symbols will consequently be interspersed throughout the data frame. The encoding of this data frame, where the closure symbols are interleaved along with the remainder of the data frame, will force the encoder to the known/predetermined state.

Figure 25:
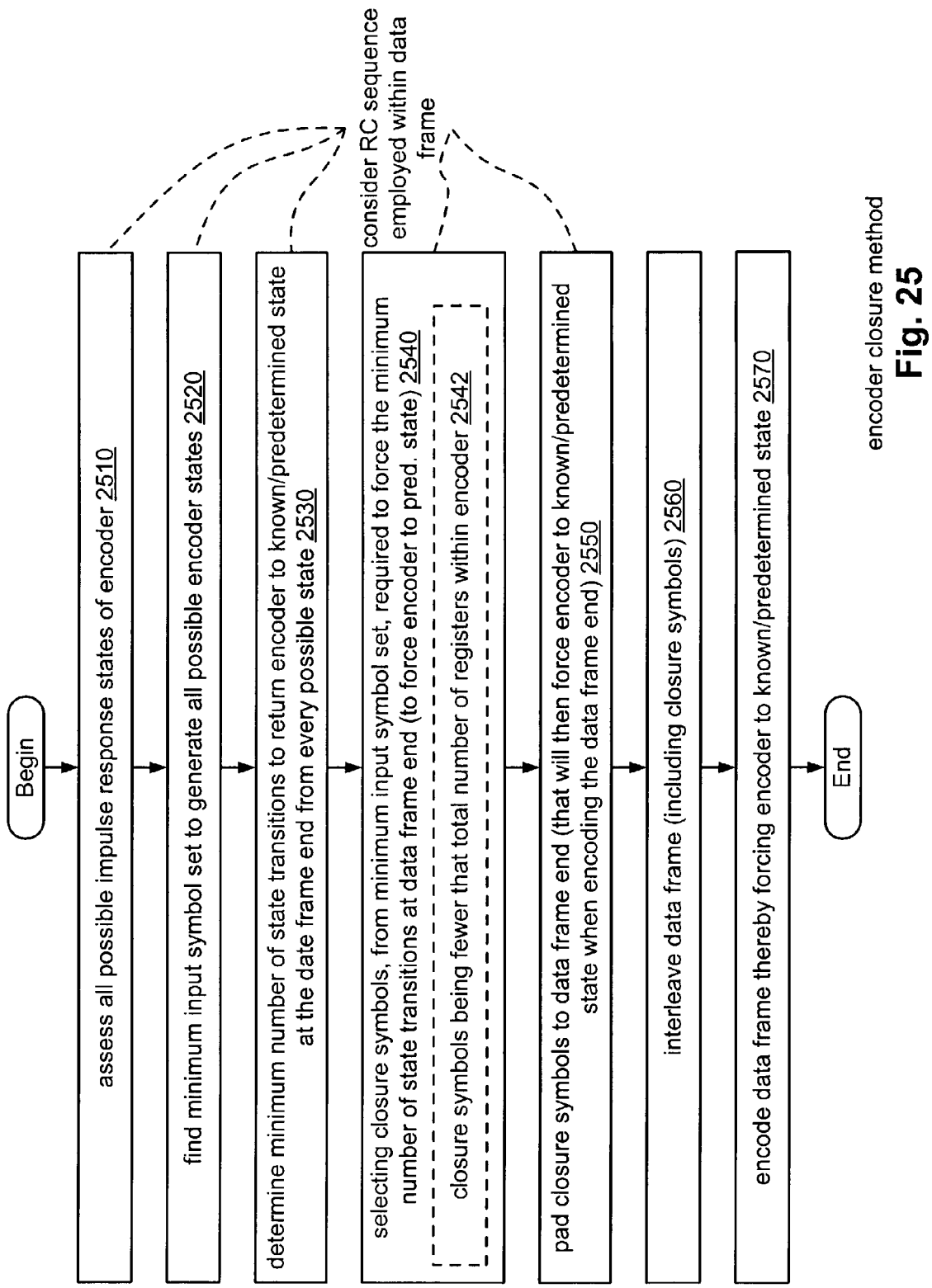
FIG. 25 is a flowchart illustrating an embodiment of an encoder closure method that is performed according to the invention.

FIG. 25 is a flowchart illustrating an embodiment of an encoder closure method that is performed according to the invention. Within the FIG. 25, all possible impulse response states of encoder are assessed as shown in a block 2510. Then, as shown in a block 2520, a minimum input symbol set is found that is able to generate all possible encoder states; a minimum group of input symbols may be found that can represent all of the other possible input symbols using linear combinations thereof. As shown in a block 2530, a minimum number of state transitions is determined that is operable to return encoder to known/predetermined state at the date frame end from every possible state.

As shown in a block 2540, closure symbols are selected, from minimum input symbol set, that are required to force the minimum number of state transitions at data frame end thereby forcing the encoder to the predetermined state. These closure symbols may be fewer in number that the total number of registers that are employed within encoder, as shown in a block 2542.

Then, as shown in a block 2550, these closure symbols are padded to the end of the data frame. These closure symbols, appropriately selected while also considering any possible interleaving that may be performed, will then force the encoder to the known/predetermined state when the data frame is encoded. As shown in a block 2560, the data frame is interleaved; this includes interleaving the closure symbols as well. Afterwards, after the data frame (including any of its closure symbols) is interleaved, then the data frame is encoded thereby forcing encoder to known/predetermined state, as shown in a block 2570.

It is noted that the method of the FIG. 27 is also operable to accommodate those embodiments where no interleaving is performed (the interleaver performs an identity interleaving process). In such an instance, the closure symbols would be selected while considering this variation, and the closure symbols will be padded to the end of the data frame that will force the encoder to the known/predetermined state after the data frame is encoded.

It is also noted that all of the functionality supported within any of the various embodiments described herein may also be performed when considering the rate control (RC) sequence tat may be used to direct the encoding of individual symbols within the data frame. For example, the individual symbols of the data frame may each be encoded using individual rate controls while simultaneously supported the encoder closure functionality and methods described herein.

In view of the above detailed description of the invention and associated drawings, other modifications and variations will now become apparent. It should also be apparent that such other modifications and variations may be effected without departing from the spirit and scope of the invention.

What is claimed is:

1. A method for determining a plurality of closure symbols that will force an encoder to a predetermined state, the method comprising:

assessing a plurality of impulse response states of the encoder;

for each impulse response state of the plurality of impulse response states of the encoder, finding a minimum plurality of input symbols that, when applied to the encoder, will force the encoder to the predetermined state;

for a data frame comprising a plurality of input symbols that will place the encoder into a particular impulse response state, determining a minimum plurality of encoder state transitions required to force the encoder to the predetermined state;

selecting a plurality of closure symbols, from the minimum plurality of input symbols that, when padded to an end of the data frame, will force the encoder to undergo the minimum plurality of encoder state transitions when transitioning from one impulse response state of the plurality of impulse response states to the predetermined state;

padding the plurality of closure symbols to the end of the data frame; and encoding the data frame; and wherein the encoding of the data frame forces the encoder to the predetermined state at the end of the data frame.

2. The method of claim 1, wherein the data frame comprises the plurality of closure symbols padded to the end of the data frame and a remaining plurality of input symbols; and further comprising interleaving the data frame, that comprises the plurality of closure symbols and the remaining plurality of input symbols, before encoding the data frame.

3. The method of claim 1, wherein the encoder comprises a plurality of registers; and the plurality of closure symbols comprises a number of closure symbols that is less than a number of registers of the plurality of registers.

4. The method of claim 3, wherein the encoder comprises three registers; and the plurality of closure symbols comprises two closure symbols.

5. The method of claim 1, wherein the encoder comprises at least one of a convolutional encoder, a turbo encoder comprising a single interleaver, a turbo encoder comprising dual interleavers, and a Turbo Trellis Coded Modulation (TTCM) encoder.

6. The method of claim 5, wherein at least one of the turbo encoder comprising a single interleaver, the turbo encoder comprising dual interleavers, and the TTCM encoder comprises two constituent encoders; and wherein the encoding of the data frame forces both of the two constituent encoders to the predetermined state.

7. The method of claim 1, further comprising encoding the plurality of input symbols according to a rate control sequence.

8. The method of claim 7, wherein the rate control sequence comprises a plurality of modulations; and each modulation of the plurality of modulations comprises a constellation and a mapping.

9. The method of claim 1, wherein the encoder is contained within at least one of a satellite transmitter, a High Definition Television (HDTV) transmitter, a mobile transmitter, a base station transmitter, a transmitter, a mobile unit, a transceiver, and a Dense Wavelength Division Multiplexing (DWDM) line card.

10. The method of claim 1, wherein the encoder is implemented within a communication transmitter; and the communication transmitter is contained within at least one of a satellite communication system, a High Definition Television (HDTV) communication system, a cellular communication system, a microwave communication system, a point-to-point communication system, a uni-directional communication system, a bi-directional communication system, a one to many communication system, and a fiber-optic communication system.

11. A method for determining a plurality of closure symbols that will force an encoder to a predetermined state, the method comprising:

assessing a plurality of impulse response states of the encoder;

for each impulse response state of the plurality of impulse response states of the encoder, finding a minimum plurality of input symbols that, when applied to the encoder, will force the encoder to the predetermined state;

for a data frame comprising a plurality of input symbols that will place the encoder into a particular impulse response state, determining a minimum plurality of encoder state transitions required to force the encoder to the predetermined state;

selecting a plurality of closure symbols, from the minimum plurality of input symbols that, when padded to an end of the data frame, will force the encoder to undergo the minimum plurality of encoder state transitions when transitioning from one impulse response state of the plurality of impulse response states to the predetermined state;

padding the plurality of closure symbols to the end of the data frame, the data frame comprises the plurality of closure symbols padded to the end of the data frame and a remaining plurality of input symbols;

interleaving the data frame that comprises the plurality of closure symbols and the remaining plurality of symbols; and encoding the interleaved data frame; and wherein the encoding of the data frame forces the encoder to the predetermined state at the end of the data frame.

12. The method of claim 11, wherein the encoder comprises a plurality of registers; and the plurality of closure symbols comprises a number of closure symbols that is less than a number of registers of the plurality of registers.

13. The method of claim 12, wherein the encoder comprises three registers; and the plurality of closure symbols comprises two closure symbols.

14. The method of claim 11, wherein the encoder comprises at least one of a convolutional encoder, a turbo encoder comprising a single interleaver, a turbo encoder comprising dual interleavers, and a Turbo Trellis Coded Modulation (TTCM) encoder.

15. The method of claim 14, wherein at least one of the turbo encoder comprising a single interleaver, the turbo encoder comprising dual interleavers, and the TTCM encoder comprises two constituent encoders; and wherein the encoding of the interleaved data frame forces both of the two constituent encoders to the predetermined state.

16. The method of claim 11, further comprising encoding the plurality of input symbols according to a rate control sequence.

17. The method of claim 16, wherein the rate control sequence comprises a plurality of modulations; and each modulation of the plurality of modulations comprises a constellation and a mapping.

18. The method of claim 11, wherein the encoder is contained within at least one of a satellite transmitter, a High Definition Television (HDTV) transmitter, a mobile transmitter, a base station transmitter, a transmitter, a mobile unit, a transceiver, and a Dense Wavelength Division Multiplexing (DWDM) line card.

19. The method of claim 11, wherein the encoder is implemented within a communication transmitter; and the communication transmitter is contained within at least one of a satellite communication system, a High Definition Television (HDTV) communication system, a cellular communication system, a microwave communication system, a point-to-point communication system, a uni-directional communication system, a bi-directional communication system, a one to many communication system, and a fiber-optic communication system.

20. A closure operable encoder, the encoder comprising:

a constituent encoder that encodes a plurality of input symbols; and a closure generator that assesses a plurality of impulse response states of the constituent encoder; and wherein for each impulse response state of the plurality of impulse response states of the constituent encoder, the closure generator finds a minimum plurality of input symbols that, when applied to the constituent encoder, will force the constituent encoder to the predetermined state;

for a data frame comprising a plurality of input symbols that will place the constituent encoder into a particular impulse response state, the closure generator determines a minimum plurality of encoder state transitions required to force the constituent encoder to the predetermined state;

the closure generator selects a plurality of closure symbols, from the minimum plurality of input symbols that, when padded to an end of the data frame, will force the constituent encoder to undergo the minimum plurality of encoder state transitions when transitioning from one impulse response state of the plurality of impulse response states to the predetermined state;

the closure generator pads the plurality of closure symbols to the end of the data frame; and the constituent encoder is forced to the predetermined state at the end of the data frame when encoding the data frame.

21. The encoder of claim 20, further comprising an interleaver, communicatively coupled to the constituent encoder, that is operable to interleave the data frame that comprises the plurality of input symbols and the closure symbols; and wherein the constituent encoder encodes the interleaved data frame; and the constituent encoder is forced to the predetermined state at the end of the data frame when encoding the interleaved data frame.

22. The encoder of claim 20, wherein the encoder comprises a plurality of registers; and the plurality of closure symbols comprises a number of closure symbols that is less than a number of registers of the plurality of registers.

23. The encoder of claim 22, the encoder comprises three registers; and the minimum plurality of input symbols comprises two input symbols.

24. The encoder of claim 20, wherein the encoder comprises at least one of a convolutional encoder, a turbo encoder comprising a single interleaver, a turbo encoder comprising dual interleavers, and a Turbo Trellis Coded Modulation (TTCM) encoder.

25. The encoder of claim 24, wherein at least one of the turbo encoder comprising a single interleaver, the turbo encoder comprising dual interleavers, and the TTCM encoder comprises two constituent encoders; and wherein the encoding of the interleaved data frame forces both of the two constituent encoders to the predetermined state.

26. The encoder of claim 20, further comprising a rate control sequencer that directs the encoder to encode the plurality of input symbols according to a rate control sequence.

27. The encoder of claim 26, wherein the rate control sequence comprises a plurality of modulations; and each modulation of the plurality of modulations comprises a constellation and a mapping.

28. The encoder of claim 20, wherein the encoder is contained within at least one of a satellite transmitter, a High Definition Television (HDTV) transmitter, a mobile transmitter, a base station transmitter, a transmitter, a mobile unit, a transceiver, and a Dense Wavelength Division Multiplexing (DWDM) line card.

29. The encoder of claim 20, wherein the encoder is implemented within a communication transmitter; and the communication transmitter is contained within at least one of a satellite communication system, a High Definition Television (HDTV) communication system, a cellular communication system, a microwave communication system, a point-to-point communication system, a uni-directional communication system, a bi-directional communication system, a one to many communication system, and a fiber-optic communication system.

30. A closure operable dual interleaver turbo encoder that encodes a plurality of input symbols, the encoder comprising:

a top interleaver;

a top constituent trellis encoder that is communicatively coupled to the top interleaver;

a bottom interleaver;

a bottom constituent trellis encoder that is communicatively coupled to the bottom interleaver;

a closure generator that is communicatively coupled to the top interleaver and the bottom interleaver;

a multiplexor that alternatively selects encoded bits that are output from the top constituent trellis encoder and the bottom constituent trellis encoder; and wherein the closure generator assesses a plurality of impulse response states for both the top constituent trellis encoder and the bottom constituent trellis encoder;

for each impulse response state of the plurality of impulse response states of the top constituent trellis encoder and the bottom constituent trellis encoder, the closure generator finds a minimum plurality of input symbols that, when applied to at least one of the top constituent trellis encoder and the bottom constituent trellis encoder, will force at least one of the top constituent trellis encoder and the bottom constituent trellis encoder to the predetermined state;

for a data frame comprising a plurality of input symbols that will place at least one of the top constituent trellis encoder and the bottom constituent trellis encoder into a particular impulse response state, the closure generator determines a minimum plurality of encoder state transitions required to force at least one of the top constituent trellis encoder and the bottom constituent trellis encoder to the predetermined state;

the closure generator selects a plurality of closure symbols, from the minimum plurality of input symbols that, when padded to an end of the data frame, will force at least one of the top constituent trellis encoder and the bottom constituent trellis encoder to undergo the minimum plurality of encoder state transitions when transitioning from one impulse response state of the plurality of impulse response states to the predetermined state;

the closure generator pads the plurality of closure symbols to the end of the data frame;

the top interleaver interleaves the data frame that comprises the plurality of input symbols and the closure symbols;

the bottom interleaver interleaves the data frame that comprises the plurality of input symbols and the closure symbols; and at least one of the top constituent trellis encoder and the bottom constituent trellis encoder is forced to the predetermined state at the end of the data frame when encoding the data frame.

31. The encoder of claim 30, further comprising a rate control sequencer that directs the top constituent trellis encoder and the bottom constituent trellis encoder to encode the plurality of input symbols according to a rate control sequence.

32. The encoder of claim 31, wherein the rate control sequence comprises a plurality of modulations; and
each modulation of the plurality of modulations comprises a constellation and a mapping; and
further comprising a puncturing functional block that punctures a predetermined number of the encoded bits that are output from the multiplexor according to the modulation of the rate control sequence.

33. The encoder of claim 30, wherein the encoder is contained within at least one of a satellite transmitter, a High Definition Television (HDTV) transmitter, a mobile transmitter, a base station transmitter, a transmitter, a mobile unit, a transceiver, and a Dense Wavelength Division Multiplexing (DWDM) line card.

34. The encoder of claim 30, wherein the encoder is implemented within a communication transmitter; and
the communication transmitter is contained within at least one of a satellite communication system, a High Definition Television (HDTV) communication system, a cellular communication system, a microwave communication system, a point-to-point communication system, a uni-directional communication system, a bi-directional communication system, a one to many communication system, and a fiber-optic communication system.

* * * * *